US010510353B2

(12) United States Patent
Nishigori et al.

(10) Patent No.: US 10,510,353 B2
(45) Date of Patent: Dec. 17, 2019

(54) ENCODING DEVICE AND METHOD, DECODING DEVICE AND METHOD, AND PROGRAM

(71) Applicant: Sony Corporation, Tokyo (JP)

(72) Inventors: Shuichiro Nishigori, Tokyo (JP); Shiro Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/037,574

(22) Filed: Jul. 17, 2018

(65) Prior Publication Data

US 2018/0322885 A1    Nov. 8, 2018

Related U.S. Application Data

(63) Continuation of application No. 15/500,253, filed as application No. PCT/JP2015/070924 on Jul. 23, 2015, now Pat. No. 10,049,677.

(30) Foreign Application Priority Data

Aug. 6, 2014   (JP) ................. 2014-160417

(51) Int. Cl.
*G10L 19/02* (2013.01)
*G10L 19/04* (2013.01)
(Continued)

(52) U.S. Cl.
CPC .......... *G10L 19/0204* (2013.01); *G10L 19/02* (2013.01); *G10L 19/0212* (2013.01);
(Continued)

(58) Field of Classification Search
CPC ......... G10L 19/02; G10L 19/04; G10L 19/06; G10L 19/07
See application file for complete search history.

(56) References Cited

U.S. PATENT DOCUMENTS

| 2007/0016412 A1* | 1/2007 | Mehrotra | ............ | G10L 19/0208 |
| | | | | 704/229 |
| 2007/0293960 A1* | 12/2007 | Fujii | ................... | G10L 19/0204 |
| | | | | 700/94 |

(Continued)

FOREIGN PATENT DOCUMENTS

| EP | 2291842 B1 | 3/2014 |
| JP | 2011-215198 A | 10/2011 |

(Continued)

OTHER PUBLICATIONS

U.S. Appl. No. 15/500,253, filed Jan. 30, 2017, Nishigori et al.

(Continued)

*Primary Examiner* — Shreyans A Patel
(74) *Attorney, Agent, or Firm* — Wolf, Greenfield & Sacks, P.C.

(57) ABSTRACT

The present technology relates to an encoding device and a method, a decoding device and a method, and a program that enables acquisitions of high-quality sound even in a resource-poor setting.
A demultiplexer demultiplexes a supplied code string, to obtain the quantized low-band spectrum, the spectral characteristic code, and the quantized expansion coefficient(s). At this point, the code string includes a single quantized expansion coefficient or quantized expansion coefficients of the respective bands in the high band depending on the spectral characteristic code. A spectral inverse quantization unit obtains the low-band spectrum by inversely quantizing the quantized low-band spectrum. An expansion coefficient inverse quantization unit obtains the expansion coefficient(s) by inversely quantizing the quantized expansion coefficient(s). An expanded spectrum generation unit generates an expanded spectrum, in accordance with the low-band spectrum and the expansion coefficient(s) depending on the spectral characteristic code. An IMDCT unit gener- (Continued)

ates a band-expanded time-series signal from the low-band spectrum and the expanded spectrum. The present technology can be applied to decoding devices.

7 Claims, 17 Drawing Sheets

(51) Int. Cl.
*G10L 19/06* (2013.01)
*G10L 19/07* (2013.01)
*G10L 21/0388* (2013.01)
*H03M 7/30* (2006.01)
*G10L 21/038* (2013.01)
*G10L 19/22* (2013.01)
*G10L 19/24* (2013.01)

(52) U.S. Cl.
CPC ........ *G10L 21/038* (2013.01); *G10L 21/0388* (2013.01); *H03M 7/30* (2013.01); *G10L 19/22* (2013.01); *G10L 19/24* (2013.01)

(56) References Cited

U.S. PATENT DOCUMENTS

| | | | |
|---|---|---|---|
| 2008/0262835 A1 | 10/2008 | Oshikiri | |
| 2009/0265167 A1* | 10/2009 | Ehara | G10L 19/265 704/219 |
| 2010/0250261 A1 | 9/2010 | Laaksonen et al. | |
| 2012/0243526 A1 | 9/2012 | Yamamoto et al. | |
| 2013/0028427 A1* | 1/2013 | Yamamoto | G10L 21/038 381/22 |
| 2013/0290003 A1 | 10/2013 | Choo | |
| 2017/0270940 A1 | 9/2017 | Nishigori et al. | |

FOREIGN PATENT DOCUMENTS

| | | |
|---|---|---|
| JP | 2011-248378 A | 12/2011 |
| JP | 5325293 A | 7/2013 |
| JP | 5329714 A | 8/2013 |
| JP | 2013-178546 A | 9/2013 |
| WO | WO 2013/124445 A2 | 8/2013 |

OTHER PUBLICATIONS

International Search Report and Written Opinion and English translation thereof dated Oct. 20, 2015 in connection with International Application No. PCT/JP2015/070924.

International Preliminary Report on Patentability and English translation thereof dated Feb. 16, 2017 in connection with International Application No. PCT/JP2015/070924.

Extended European Search Report dated Dec. 5, 2017 in connection with European Application No. 15830713.2.

* cited by examiner

ENCODING DEVICE AND METHOD, DECODING DEVICE AND METHOD, AND PROGRAM

CROSS REFERENCE TO RELATED APPLICATIONS

This application is a continuation of U.S. patent application Ser. No. 15/500,253, filed on Jan. 30, 2017, now U.S. Pat. No. 10,049,677, which is a national stage entry filed under 35 U.S.C. § 371 of PCT Application No. PCT/JP2015/070924, filed Jul. 23, 2015, which claims priority to Japanese Patent Application JP2014-160417, filed on Aug. 6, 2014. The contents of these applications are hereby incorporated by reference in their entireties.

TECHNICAL FIELD

The present technology relates to an encoding device and a method, a decoding device and a method, and a program. More particularly, the present technology relates to an encoding device and a method, a decoding device and a method, and a program that enable acquisitions of high-quality sound in a resource-poor setting.

BACKGROUND ART

There is a known coding technology that utilizes the concept of a band expansion for an audio signal (see Patent Document 1 and Patent Document 2, for example).

By such a coding technology, a time-series signal that is input as an audio signal is divided into a low-band component and a high-band component. Conventional encoding is performed on the low-band signal, and the relationship between the low-band signal and the high-band signal, the features of the high-band signal, and the like are transmitted as additional information.

Also, at the time of decoding, after the low-band signal is restored, an expanded-band signal is generated with the use of the low-band signal and the additional information. The low-band signal and the expanded-band signal are then combined, to achieve a band expansion.

More specifically, after the low-band signal is restored, the low-band signal is divided into bands by a band dividing filter, and an expanded-band signal is generated with the use of the divided low-band signal and the additional information. The low-band signal and the expanded-band signal are then combined by a band combining filter, and a band-expanded time-series signal is obtained.

Where a band dividing filter and a band combining filter are used as above, however, the fundamental delay between the signal encoding and the decoding is increased due to the filtering processes such as the band dividing process and the band combining process. As a result, the response speed between the input and the output of the audio signal becomes lower.

Further, in addition to the conventional decoding process, the filtering processes such as the band dividing process and the band combining process to be performed by a filter bank or the like become necessary. As a result, the amount of throughput and the memory usage greatly increase, which makes it difficult to install a decoding device in a resource-poor setting, such as an embedded device.

To improve such a coding technology, there is a technology suggested for enabling band expansions in frequency regions (see Patent Document 3, for example).

By this technology, a spectrum obtained through modified discrete cosine transform (MDCT) is divided into the low-band side (baseband) and the high-band side (expanded band) at the time of encoding. Conventional encoding is performed on the baseband signal, and the relationship between the spectrum of the baseband and the spectrum of the expanded band, the features of the spectrum of the expanded band, and the like are transmitted as additional information.

Further, at the time of decoding, the spectrum of the expanded band is generated with the use of the spectrum of the baseband and the additional information, and the spectrum of the baseband and the spectrum of the expanded band are then combined. In this manner, the spectrum of the entire band is generated. Further, inverse modified discrete cosine transform (IMDCT) is performed on the obtained spectrum of the entire band. As a result, the spectrum of the entire band is transformed into a time-series signal (temporal signal).

CITATION LIST

Patent Documents

Patent Document 1: Japanese Patent No. 5329714
Patent Document 2: Japanese Patent No. 5325293
Patent Document 3: Japanese Patent Application Laid-Open No. 2011-215198

SUMMARY OF THE INVENTION

Problems to be Solved by the Invention

However, both an amplitude component and a phase component are factored into the value of each of the frequency bins in a spectrum obtained through MDCT (this spectrum will be hereinafter also referred to as the MDCT spectrum). Therefore, where the amplitude of the spectrum of an expanded band is minutely adjusted with the use of an MDCT spectrum at the time of decoding according to a technology that involves a band expansion in a frequency region, the phase component of each spectrum and the mutual phase relationship between spectrums are greatly disturbed.

In such a case, if the current audio signal to be encoded or decoded is a signal of musical sound or a human voice with high noise properties, sound quality degradation noticeable to the human ear is not caused in the audio signal.

However, in a case where the audio signal is an audio signal having energy concentrating at particular frequencies of a musical instrument or effect sound, or where the audio signal is a signal with a high tonality, the energy that normally concentrates at certain frequencies is scattered in the spectrum at the adjacent frequencies due to decoding. As a result, the audio signal eventually obtained through the decoding has noise properties, and the sound quality is degraded to the human ear.

In a technology that involves a band expansion in a frequency region as described above, there is no need to perform a band dividing process and a band combining process on a time-series signal. Accordingly, sound encoding and decoding can be performed even in a resource-poor setting, without any delay. However, high-quality sound cannot be obtained in some cases.

The present technology has been made in view of such circumstances, and aims to enable acquisitions of high-quality sound even in a resource-poor setting.

Solutions to Problems

A decoding device of a first aspect of the present technology includes: an acquisition unit that acquires a low-band spectrum, and a single expansion coefficient of an expanded band or expansion coefficients of the respective bands constituting the expanded band, the expanded band being different from a low band, the single expansion coefficient or the expansion coefficients being for obtaining an expanded spectrum of the expanded band; a generation unit that generates the expanded spectrum in accordance with the single expansion coefficient or the expansion coefficients of the respective bands; and a combining unit that combines the low-band spectrum and the expanded spectrum.

The generation unit may generate the expanded spectrum in accordance with the low-band spectrum and the expansion coefficient.

The generation unit may generate the expanded spectrum by adjusting the level of a spectrum obtained from the low-band spectrum, in accordance with the expansion coefficient.

When the expanded spectrum is generated in accordance with the single expansion coefficient, the generation unit may adjust the level of the entire expanded band of the spectrum in accordance with the expansion coefficient. When the expanded spectrum is generated in accordance with the expansion coefficients of the respective bands, the generation unit may adjust the levels of the bands in the spectrum in accordance with the expansion coefficients of the bands.

The generation unit may generate the expanded spectrum by adjusting the level of predetermined noise in accordance with the expansion coefficient.

The value of the low-band spectrum may be determined by the amplitude component and the phase component of the original time-series signal.

The low-band spectrum may be an MDCT spectrum.

A decoding method or a program of the first aspect of the present technology includes the steps of: acquiring a low-band spectrum, and a single expansion coefficient of an expanded band or expansion coefficients of the respective bands constituting the expanded band, the expanded band being different from a low band, the single expansion coefficient or the expansion coefficients being for obtaining an expanded spectrum of the expanded band; generating the expanded spectrum in accordance with the single expansion coefficient or the expansion coefficients of the respective bands; and combining the low-band spectrum and the expanded spectrum.

In the first aspect of the present technology, a low-band spectrum and a single expansion coefficient of an expanded band or expansion coefficients of the respective bands constituting the expanded band are acquired, the expanded band being different from the low band, the single expansion coefficient or the expansion coefficients being for obtaining an expanded spectrum of the expanded band. The expanded spectrum is generated in accordance with the single expansion coefficient or the expansion coefficients of the respective bands, and the low-band spectrum and the expanded spectrum are combined.

An encoding device of a second aspect of the present technology includes: a feature quantity extraction unit that extracts a feature quantity from a spectrum obtained by performing orthogonal transform on a time-series signal; a calculation unit that calculates, in accordance with the feature quantity, a single expansion coefficient of an expanded band or expansion coefficients of the respective bands constituting the expanded band from the spectrum, the expanded band being different from the low band of the spectrum, the single expansion coefficient or the expansion coefficients being for obtaining an expanded spectrum of the expanded band; and a multiplexer that generates a code string by multiplexing a low-band spectrum as the low-band component of the spectrum and the expansion coefficient.

The feature quantity may be information indicating the tonality of the spectrum.

When the tonality of the spectrum is high, the calculation unit may calculate the single expansion coefficient. When the tonality of the spectrum is low, the calculation unit may calculate the expansion coefficients of the respective bands.

The calculation unit may calculate the ratio between the mean amplitude of the expanded band of the spectrum to the mean amplitude of the low-band spectrum, and set the ratio as the expansion coefficient.

When the tonality of the low band of the spectrum is high while the tonality of the expanded band of the spectrum is low, the calculation unit may calculate envelope information about the expanded band of the spectrum as the expansion coefficient.

The value of the spectrum may be determined by the amplitude component and the phase component of the time-series signal.

The orthogonal transform may be MDCT.

An encoding method or a program of the second aspect of the present technology includes the steps of: extracting a feature quantity from a spectrum obtained by performing orthogonal transform on a time-series signal; calculating, in accordance with the feature quantity, a single expansion coefficient of an expanded band or expansion coefficients of the respective bands constituting the expanded band from the spectrum, the expanded band being different from the low band of the spectrum, the single expansion coefficient or the expansion coefficients being for obtaining an expanded spectrum of the expanded band; and generating a code string by multiplexing a low-band spectrum as the low-band component of the spectrum and the expansion coefficient.

In the second aspect of the present technology, a feature quantity is extracted from a spectrum obtained by performing orthogonal transform on a time-series signal. In accordance with the feature quantity, a single expansion coefficient of an expanded band or expansion coefficients of the respective bands constituting the expanded band are calculated from the spectrum, the expanded band being different from the low band of the spectrum, the single expansion coefficient or the expansion coefficients being for obtaining an expanded spectrum of the expanded band. A code string is generated by multiplexing a low-band spectrum as the low-band component of the spectrum and the expansion coefficient.

Effects of the Invention

According to the first aspect and the second aspect of the present technology, high-quality sound can be obtained even in a resource-poor setting.

It should be noted that the effects of the present technology are not limited to the effects described herein, and may include any of the effects described in the present disclosure.

MODES FOR CARRYING OUT THE INVENTION

The following is a description of embodiments to which the present technology is applied, with reference to the drawings.

First Embodiment

<Example Configuration of an Encoding Device>

Figure 1:
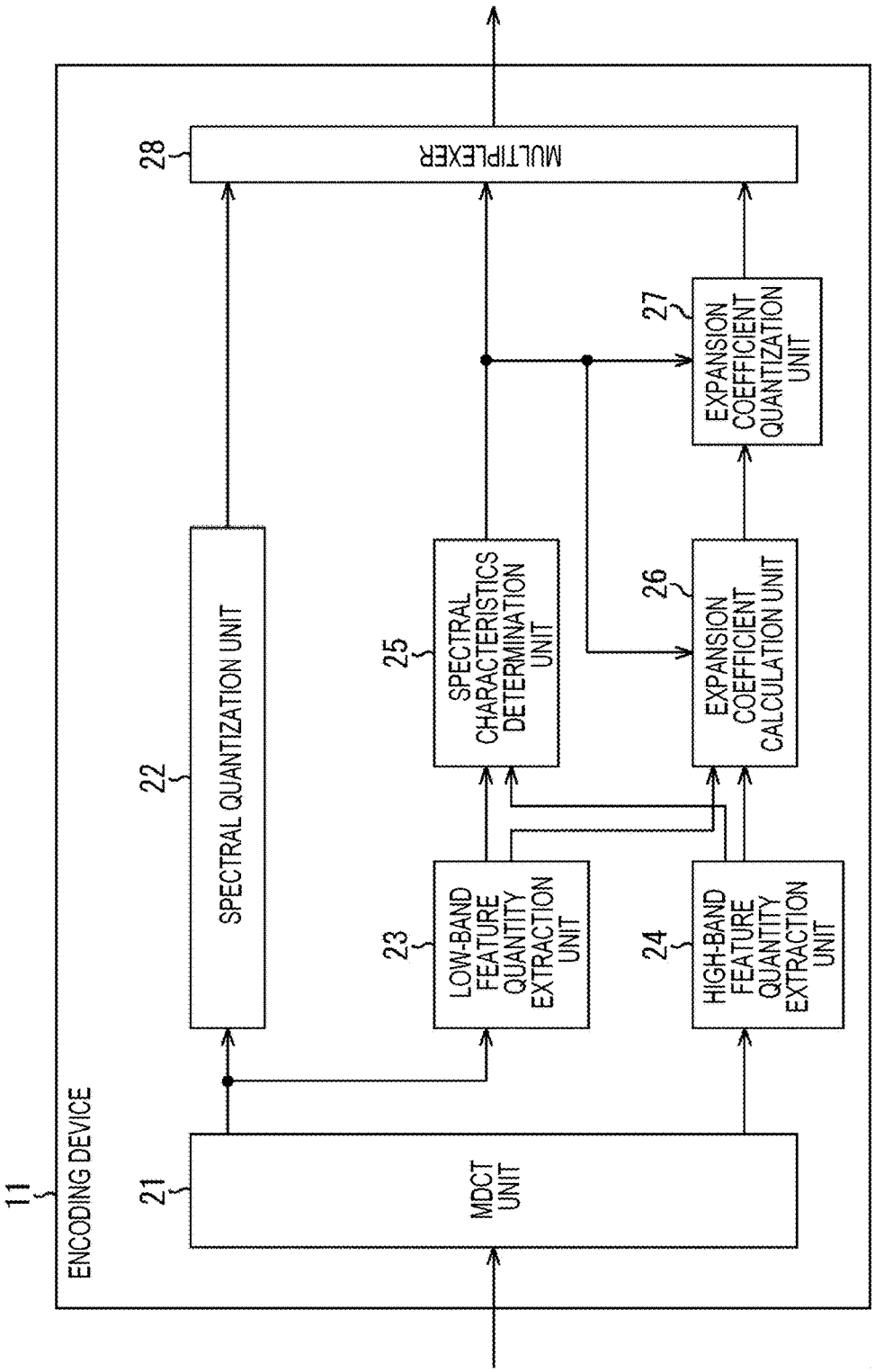
FIG. 1 is a diagram showing an example configuration of an encoding device.

FIG. 1 is a diagram showing an example configuration of an embodiment of an encoding device to which the present technology is applied.

The encoding device 11 shown in FIG. 1 includes an MDCT unit 21, a spectral quantization unit 22, a low-band feature quantity extraction unit 23, a high-band feature quantity extraction unit 24, a spectral characteristics determination unit 25, an expansion coefficient calculation unit 26, an expansion coefficient quantization unit 27, and a multiplexer 28.

An input signal that is a time-series signal of a sampling frequency Fs [kHz] is supplied as the current audio signal to be encoded, to the MDCT unit 21.

The MDCT unit 21 performs MDCT as orthogonal transform, for example, on the supplied input signal, and obtains a spectrum from a frequency Dc [kHz] that is a DC component to a frequency Fs/2 that is half the sampling frequency Fs.

It should be noted that, in the example case described below, MDCT is performed as orthogonal transform. However, any transform other than MDCT may be performed, as long as both an amplitude component and a phase component are factored into the value of the spectrum obtained through the orthogonal transform.

Also, to increase coding efficiency in this example, the component to be actually encoded in the spectrum obtained through the orthogonal transform is the component from the frequency Dc to a frequency Fc [kHz] to which the sense of hearing is sensitive, and the rest of the spectrum is to be discarded. That is, the portion from the frequency Fc to the frequency Fs/2 in the spectrum is to be discarded.

To further increase coding efficiency, a band expansion is performed on the decoding side.

Figure 2:
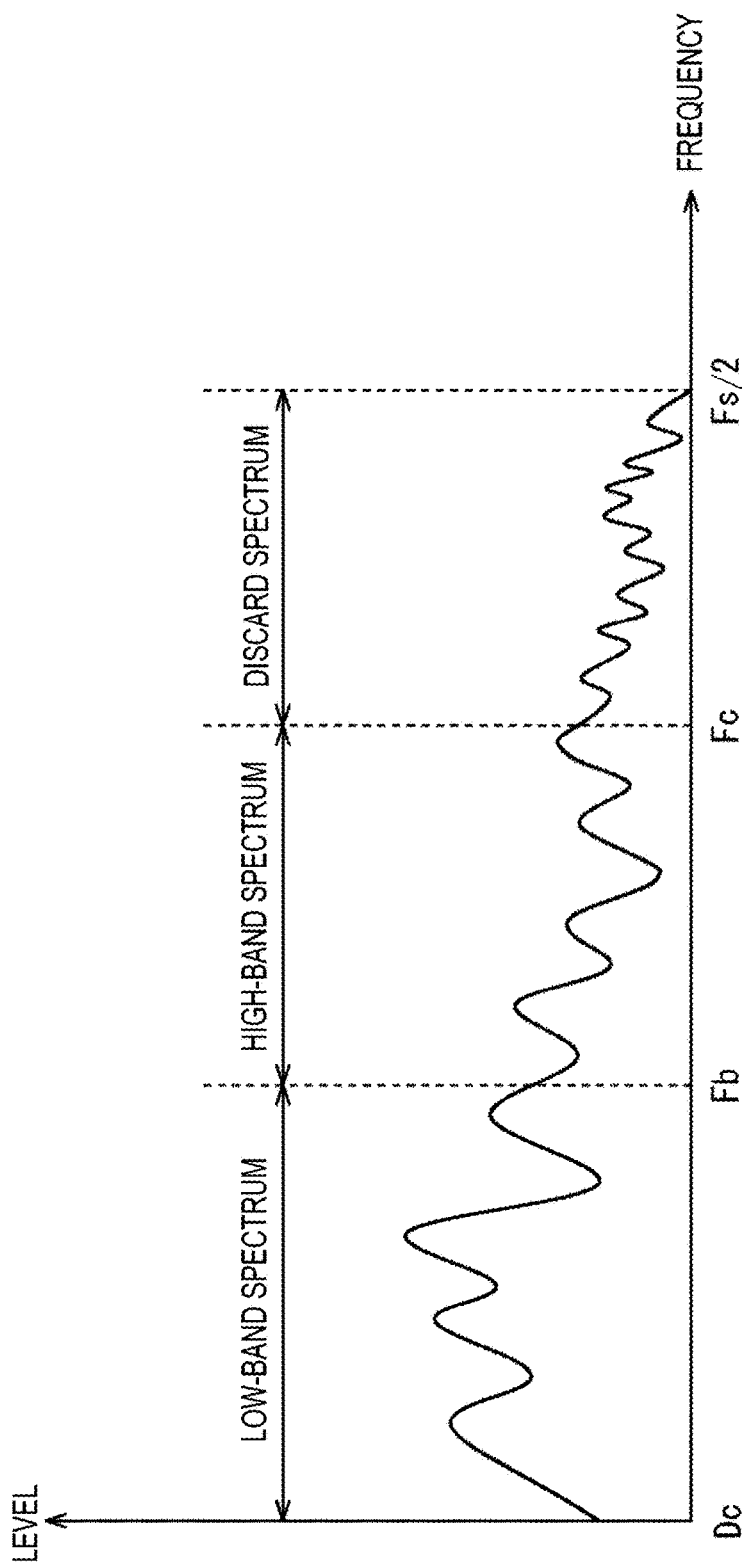
FIG. 2 is a graph for explaining spectral regions and the boundaries.

As shown in FIG. 2, for example, the spectrum obtained through the orthogonal transform performed at the MDCT unit 21 is divided into a low-band spectrum, a high-band spectrum, and a discard spectrum. It should be noted that the ordinate axis in FIG. 2 indicates spectral value or level, and the abscissa axis indicates frequency.

In this example, the component from the frequency Dc as the DC component to the upper limit frequency Fb [kHz] in the entire spectrum is the low-band spectrum, and conventional encoding is performed on the low-band spectrum when an input signal is encoded.

Meanwhile, the component from the upper limit frequency Fb to the frequency Fc in the entire spectrum is the high-band spectrum. Encoding is not performed on this high-band spectrum when an input signal is encoded. At the time of decoding, however, a pseudo high-band spectrum (hereinafter also referred to as an expanded spectrum) is generated with the use of the low-band spectrum and an expansion coefficient that is additional information described later, and thus, a band expansion is achieved. That is, at the time of decoding, the frequency band from the upper limit frequency Fb to the frequency Fc is the expanded band that is the current band to be expanded.

Further, the portion from the frequency Fc to the frequency Fs/2 in the entire spectrum is the discard spectrum, and is discarded.

It should be noted that the band from the frequency Dc to the upper limit frequency Fb will be hereinafter referred to as the low band, and the band from the upper limit frequency Fb to the frequency Fc will be referred to as the high band. Also, the band from the frequency Fc to the frequency Fs/2 will be hereinafter referred to as the discard band.

Therefore, in this example, only the low-band component of an input signal is encoded, and a high-band component will be generated through the band expansion at the time of decoding.

Referring back to FIG. 1, the MDCT unit 21 performs MDCT on the input signal. The MDCT unit 21 then supplies the spectral quantization unit 22 and the low-band feature quantity extraction unit 23 with the low-band spectrum of the resultant spectrum of the entire band, and supplies the high-band feature quantity extraction unit 24 with the high-band spectrum.

The spectral quantization unit 22 quantizes the low-band spectrum supplied from the MDCT unit 21, and supplies the resultant quantized low-band spectrum to the multiplexer 28.

The low-band feature quantity extraction unit 23 extracts a feature quantity from the low-band spectrum supplied from the MDCT unit 21 (this feature quantity will be hereinafter also referred to as the low-band spectral feature quantity), and then supplies the feature quantity to the spectral characteristics determination unit 25. The low-band feature quantity extraction unit 23 also supplies low-band spectrum amplitude information to the expansion coefficient calculation unit 26.

The high-band feature quantity extraction unit 24 extracts a feature quantity from the high-band spectrum supplied from the MDCT unit 21 (this feature quantity will be hereinafter also referred to as the high-band spectral feature quantity), and then supplies the feature quantity to the spectral characteristics determination unit 25. The high-band feature quantity extraction unit 24 also supplies high-band spectrum amplitude information to the expansion coefficient calculation unit 26.

The low-band spectral feature quantity and the high-band spectral feature quantity are now described.

To extract feature quantities such as the low-band spectral feature quantity and the high-band spectral feature quantity from the spectrum obtained at the MDCT unit 21, it is necessary to observe the characteristics of the spectrum amplitude. However, the spectrum obtained at the MDCT unit 21 is an MDCT spectrum obtained through MDCT, for example, and has different characteristics from those of a DFT spectrum obtained through discrete Fourier transform (DFT). It should be noted that an MDCT spectrum is also called an MDCT coefficient.

Specifically, a DFT spectrum includes an amplitude component and a phase component that are independent of each other. On the other hand, both the amplitude component and the phase component are factored into the value of the MDCT spectrum or the values of the respective frequency bins in the MDCT spectrum. That is, the value of the MDCT spectrum is determined by the amplitude component and the phase component of the input signal, and the value of only the amplitude component or the phase component cannot be known from the value of the MDCT spectrum.

Therefore, in a case where a DFT spectrum is used, the amplitude of a signal can be observed with the use of an amplitude spectrum or a power spectrum. In the case of an MDCT spectrum, however, it is difficult to observe the amplitude of a signal from the MDCT spectrum that has not been changed.

In view of this, IMDCT, which is the inverse transform of the MDCT, may be performed on the MDCT spectrum so that the input signal is returned to a time-series signal. DFT may be then performed on the time-series signal to extract feature quantities.

In such a case, however, it is necessary to further add processing blocks for IMDCT and DFT to the encoding device 11, and there will be large increases in the amount of calculation and the usage of memories such as a read only memory (ROM) and a random access memory (RAM). This will lead to difficulties in encoding an input signal in a low-resource environment, such as a portable device, where there is only a limited operation resource.

To counter this, the encoding device 11 to which the present technology is applied calculates a pseudo amplitude spectrum $S_k$ according to the equation (1) on the basis of an MDCT spectrum, and uses the pseudo amplitude spectrum $S_k$ in extracting a feature quantity.

[Mathematical Formula 1]

$$S_k = \sqrt{y_k^2 + (y_{k-1} - y_{k+1})^2} \tag{1}$$

It should be noted that, in the equation (1), the pseudo amplitude spectrum $S_k$ represents the pseudo amplitude spectrum corresponding to the kth frequency bin in the MDCT spectrum, and $y_k$ represents the MDCT spectral value corresponding to the kth frequency bin. Therefore, according to the equation (1), the pseudo amplitude spectrum $S_k$ related to one frequency bin is calculated in accordance with the MDCT spectral values corresponding to three consecutive frequency bins.

The value of the pseudo amplitude spectrum $S_k$ obtained in this manner is a value similar to the amplitude spectrum. That is, the value of the pseudo amplitude spectrum $S_k$ is a value having a high correlation with the amplitude spectrum of a DFT spectrum, and therefore, it is safe to say that the value of the pseudo amplitude spectrum $S_k$ indicates a pseudo amplitude value at each frequency in the MDCT spectrum.

It should be noted that, hereinafter, the pseudo amplitude spectrum determined for the low-band spectrum will also be referred to specifically as the low-band pseudo amplitude spectrum, and the pseudo amplitude spectrum determined for the high-band spectrum will also be referred to specifically as the high-band pseudo amplitude spectrum.

The low-band feature quantity extraction unit 23 and the high-band feature quantity extraction unit 24 calculate pseudo amplitude spectrums $S_k$ according to the equation (1) for the respective frequencies in the low-band spectrum and the high-band spectrum, and calculate feature quantities from the obtained pseudo amplitude spectrums $S_k$ of the respective frequency bins.

For example, the low-band feature quantity extraction unit 23 and the high-band feature quantity extraction unit 24 calculate degrees of spectral flatness (hereinafter also referred to as SF) as the low-band spectral feature quantity and the high-band spectral feature quantity according to the equation (2) shown below. A spectral flatness serves as an indicator of the noise properties of a spectrum.

[Mathematical Formula 2]

$$SF = \frac{\sqrt[N]{\prod_{i=0}^{N-1} S_i}}{\frac{\sum_{i=0}^{N-1} S_i}{N}} \tag{2}$$

It should be noted that, in the equation (2), N represents the number of the current spectrums, or the number of frequency bins. Meanwhile, $S_i$ represents the value of the pseudo amplitude spectrum of the ith frequency bin.

Therefore, in a case where an SF is determined for the high-band spectrum, for example, the SF is the ratio of the arithmetic mean of the pseudo amplitude spectrums $S_k$ determined for all the frequency bins in the high-band spectrum to the geometric mean of the pseudo amplitude spectrums $S_k$ determined for all the frequency bins in the high-band spectrum.

The SF calculated in this manner indicates the degree of flatness of the spectrum, and has a value that falls within the range of 0.0 to 1.0.

For example, where the value of the SF is greater, or where the value of the SF is closer to 1.0, the rise and fall of the spectrum is smaller, and the spectrum is flatter, which indicates higher noise properties. Where the value of the SF is smaller, or where the value of the SF is closer to 0.0, on the other hand, the tonality of the spectrum is higher (the noise properties are lower).

It should be noted that, although SFs are calculated as feature quantities in the above described example, any other appropriate quantities may be calculated as feature quantities.

Other than SFs, there are indexes indicating noise properties of spectrums or indexes indicating the degree of tonality, for example. Therefore, some other indexes indicating noise properties may be calculated as feature quantities in accordance with the degree of feature quantity accuracy required and the amount of calculation allowed in the encoding device 11.

As an example of a different feature quantity from an SF, the degree of spectral concentration D in the equation (3) shown below may be calculated as the low-band spectral feature quantity or the high-band spectral feature quantity.

[Mathematical Formula 3]

$$D = \frac{\text{Max}(S_i)}{\frac{\sum_{i=0}^{N-1} S_i}{N}} \quad (3)$$

It should be noted that, in the equation (3), N represents the number of the current spectrums, or the number of frequency bins. Meanwhile, $S_i$ represents the value of the pseudo amplitude spectrum corresponding to the ith frequency bin, and Max($S_i$) represents the largest value among the pseudo amplitude spectrums $S_i$ corresponding to the respective frequency bins.

Accordingly, in the example expressed by the equation (3), the ratio of the arithmetic mean of the pseudo amplitude spectrums $S_k$ to the largest value among the pseudo amplitude spectrum $S_k$ is the degree of spectral concentration D.

Where the degree of spectral concentration D is higher in an MDCT spectrum, the spectral distribution tends to be biased and have a high tonality. Where the degree of spectral concentration D is lower in an MDCT spectrum, on the other hand, the spectral distribution tends to be flat and have high noise properties.

Although any appropriate quantities may be calculated as feature quantities in this manner, SFs are calculated as feature quantities in the description continued below.

Figure 3:
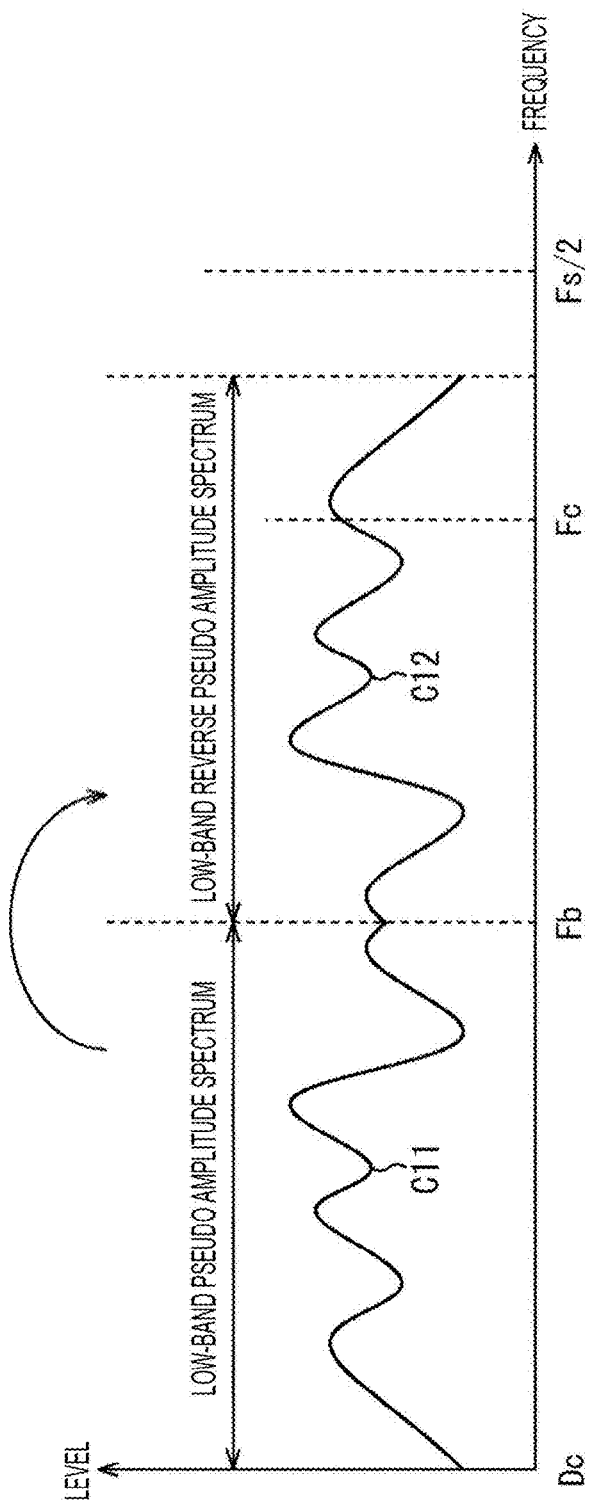
FIG. 3 is a graph for explaining a low-band reverse pseudo amplitude spectrum.

Specifically, in a case where the low-band feature quantity extraction unit 23 calculates the low-band spectral feature quantity, the above described SF is calculated with respect to a low-band reverse pseudo amplitude spectrum that is obtained by reversing the low-band pseudo amplitude spectrum calculated with respect to the low-band spectrum on the high-band side, with the upper limit frequency Fb being the boundary, as shown in FIG. 3.

It should be noted that the ordinate axis in FIG. 3 indicates spectral value or level, and the abscissa axis indicates frequency.

In this example, the low-band pseudo amplitude spectrum represented by a curve C11 is reversed on the high-band side at the upper limit frequency Fb, and is turned into a low-band reverse pseudo amplitude spectrum represented by a curve C12. Accordingly, the low-band pseudo amplitude spectrum and the low-band reverse pseudo amplitude spectrum form a symmetrical waveform.

Referring back to FIG. 1, the low-band feature quantity extraction unit 23 calculates an SF as the low-band spectral feature quantity according to the equation (2) with respect to each frequency bin in the band from the upper limit frequency Fb to the frequency Fc in the low-band reverse pseudo amplitude spectrum obtained through the reversal process. It should be noted that, hereinafter, the SF calculated as the low-band spectral feature quantity will also be referred to specifically as the SFL.

The low-band feature quantity extraction unit 23 supplies the spectral characteristics determination unit 25 with the SFL as the low-band spectral feature quantity obtained as above, and also supplies the expansion coefficient calculation unit 26 with the low-band reverse pseudo amplitude spectrum as amplitude information. At this point, the portion from the upper limit frequency Fb to the frequency Fc in the low-band reverse pseudo amplitude spectrum, for example, is supplied to the expansion coefficient calculation unit 26.

Meanwhile, the high-band feature quantity extraction unit 24 calculates an SF as the high-band spectral feature quantity according to the equation (2) with respect to each frequency bin in the high-band pseudo amplitude spectrum obtained from the high-band spectrum. It should be noted that, hereinafter, the SF calculated as the high-band spectral feature quantity will also be referred to specifically as the SFH.

The high-band feature quantity extraction unit 24 supplies the spectral characteristics determination unit 25 with the SFH as the high-band spectral feature quantity obtained as above, and also supplies the expansion coefficient calculation unit 26 with the high-band pseudo amplitude spectrum as amplitude information.

In accordance with the low-band spectral feature quantity supplied from the low-band feature quantity extraction unit 23 and the high-band spectral feature quantity supplied from the high-band feature quantity extraction unit 24, the spectral characteristics determination unit 25 generates a spectral characteristic code indicating the spectral characteristics of the current input signal to be encoded.

For example, in a case where both the low-band spectral feature quantity SFL and the high-band spectral feature quantity SFH are smaller than a predetermined threshold, the spectral characteristic code is a code indicating a high tonality. That is, the input signal (the MDCT spectrum) has spectral characteristics that are high in tonality. Here, the value of the spectral characteristic code indicating a high tonality is "1".

Further, in a case where the low-band spectral feature quantity SFL and/or the high-band spectral feature quantity SFH are/is equal to or greater than the threshold, the spectral characteristic code is a code not indicating a high tonality. That is, the input signal has spectral characteristics that are not high in tonality, or are high in noise properties. Here, the value of the spectral characteristic code not indicating a high tonality is "0".

As described above, the spectral characteristic code is "1" in a case where both the low-band component and the high-band component of the MDCT spectrum are high in tonality, and the spectral characteristic code is "0" in a case where the low-band component and/or the high-band component of the MDCT spectrum are/is high in noise properties.

The spectral characteristics determination unit 25 supplies the spectral characteristic code obtained in this manner to the expansion coefficient calculation unit 26, the expansion coefficient quantization unit 27, and the multiplexer 28.

The expansion coefficient calculation unit 26 calculates an expansion coefficient in accordance with the low-band reverse pseudo amplitude spectrum supplied from the low-band feature quantity extraction unit 23, the high-band pseudo amplitude spectrum supplied from the high-band feature quantity extraction unit 24, and the spectral characteristic code supplied from the spectral characteristics determination unit 25. The expansion coefficient calculation unit 26 then supplies the expansion coefficient to the expansion coefficient quantization unit 27.

Here, the expansion coefficient is information for performing high-band level adjustment in a frequency region at the time of decoding, and indicates the ratio between the high-band pseudo amplitude spectrum and the low-band reverse pseudo amplitude spectrum. In other words, the expansion coefficient indicates the ratio between the mean amplitude of the high-band spectrum and the mean amplitude of the low-band spectrum.

Specifically, in a case where the spectral characteristic code is "1", the expansion coefficient calculation unit 26 calculates the mean value of the high-band pseudo amplitude spectrums of the respective frequency bins in the high-band range or the band from the upper limit frequency Fb to the frequency Fc. The expansion coefficient calculation unit 26 also calculates the mean value of the low-band reverse pseudo amplitude spectrums of the respective frequency bins in the band from the upper limit frequency Fb to the frequency Fc, and calculates the expansion coefficient by dividing the mean value of the high-band pseudo amplitude spectrums by the mean value of the low-band reverse pseudo amplitude spectrums. In this case, one expansion coefficient is obtained for the entire high band or the entire expanded band.

Figure 4:
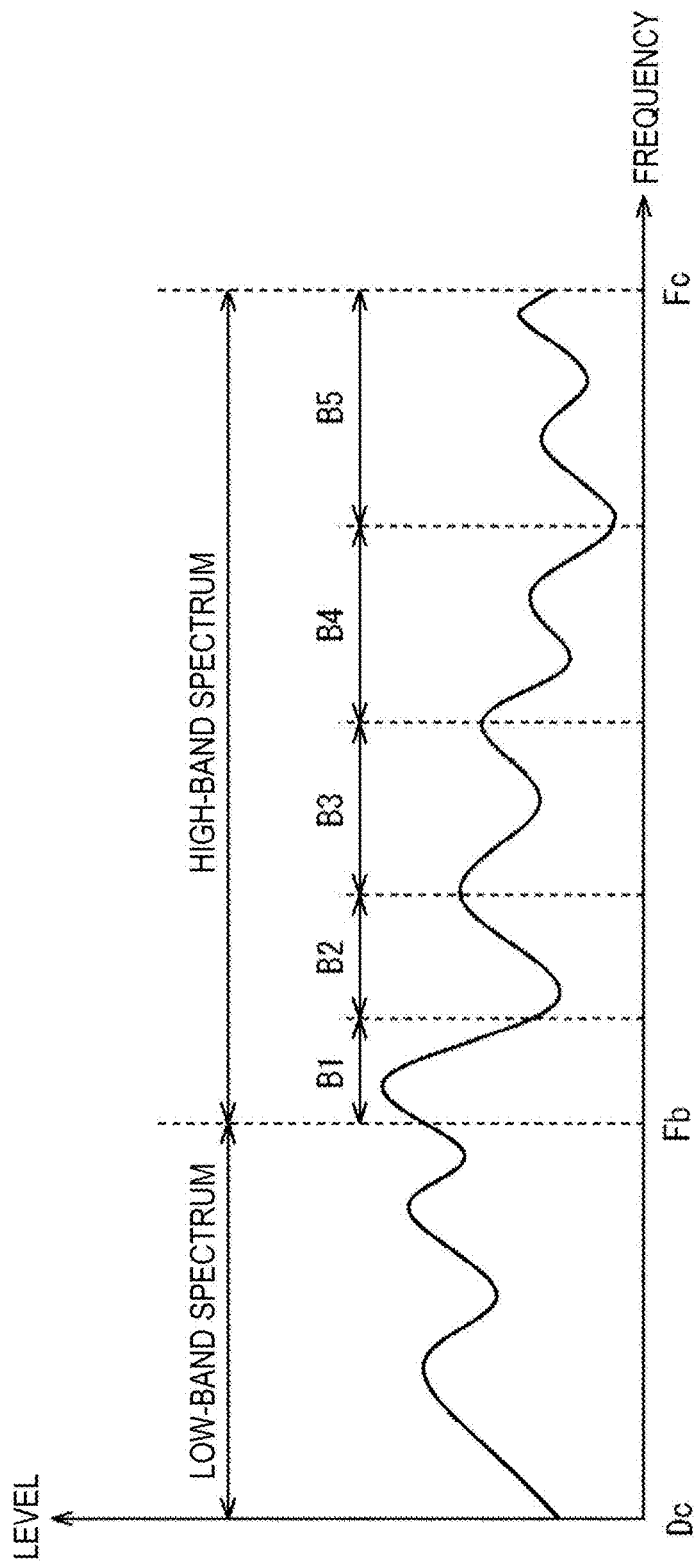
FIG. 4 is a graph for explaining dividing of a high-band spectrum.

In a case where the spectral characteristic code is "0", on the other hand, the expansion coefficient calculation unit 26 divides the high band into bands so that the divisional bandwidth becomes greater in the direction from the low-band side toward the high-band side, with the human aural characteristics being taken into account, as shown in FIG. 4, for example.

It should be noted that the ordinate axis in FIG. 4 indicates spectral value or level, and the abscissa axis indicates frequency.

In this example, the frequency band of the high-band spectrum, or the frequency band that is the high band from the upper limit frequency Fb to the frequency Fc, is divided into five bands B1 through B5. Further, the width of a band obtained through the division is greater at a portion closer to the frequency Fc.

For each of the bands B1 through B5 constituting the high band, the expansion coefficient calculation unit 26 calculates a value by dividing the mean value of the high-band pseudo amplitude spectrums by the mean value of the low-band reverse pseudo amplitude spectrums, and sets the value as the expansion coefficient of each corresponding band.

For example, the value obtained by dividing the mean value of the high-band pseudo amplitude spectrums in the respective frequency bins in the band B1 by the mean value of the low-band reverse pseudo amplitude spectrums in the respective frequency bins in the band B1 is set as the expansion coefficient of the band B1.

Accordingly, the expansion coefficient $C_i$ of the ith band (region) obtained by dividing the high band is calculated according to the equation (4) shown below.

[Mathematical Formula 4]

$$C_i = \frac{\sum_{k=0}^{M-1} S_k}{\sum_{k=0}^{M-1} L_k}} \quad (4)$$

It should be noted that, in the equation (4), $S_k$ represents the value of the high-band pseudo amplitude spectrum of the kth frequency bin in the ith band, and $L_k$ represents the value of the low-band reverse pseudo amplitude spectrum of the kth frequency bin in the ith band. Meanwhile, M represents the number of spectrums or the number of frequency bins in the ith band.

In accordance with the spectral characteristic code supplied from the spectral characteristics determination unit 25, the expansion coefficient quantization unit 27 quantizes the expansion coefficient(s) supplied from the expansion coefficient calculation unit 26. The expansion coefficient quantization unit 27 then supplies the resultant quantized expansion coefficient(s) to the multiplexer 28.

For example, in a case where the spectral characteristic code is "1", scalar quantization is performed on the single expansion coefficient calculated for the entire high band. In a case where the spectral characteristic code is "0", on the other hand, scalar quantization or vector quantization is performed on the expansion coefficients calculated for the respective bands (regions) in the divided high band.

The multiplexer 28 multiplexes the quantized low-band spectrum supplied from the spectral quantization unit 22, the spectral characteristic code supplied from the spectral characteristics determination unit 25, and the quantized expansion coefficient(s) supplied from the expansion coefficient quantization unit 27, and outputs the resultant code string. In doing so, the multiplexer 28 performs entropy coding on the quantized low-band spectrum, and also encodes the quantized expansion coefficient(s).

<Explanation of an Encoding Process>

Next, operation of the encoding device 11 is described.

When the current input signal to be encoded is supplied from outside, for example, the encoding device 11 starts an encoding process, to encode the input signal. Referring now to the flowchart in FIG. 5, an encoding process to be performed by the encoding device 11 is described.

In step S11, the MDCT unit 21 performs MDCT on the supplied input signal. The MDCT unit 21 then supplies the spectral quantization unit 22 and the low-band feature quantity extraction unit 23 with the low-band spectrum that is the low-band portion of the MDCT spectrum obtained through the MDCT, and supplies the high-band feature quantity extraction unit 24 with the high-band spectrum that is the high-band portion of the MDCT spectrum.

In step S12, the spectral quantization unit 22 quantizes the low-band spectrum supplied from the MDCT unit 21, and supplies the resultant quantized low-band spectrum to the multiplexer 28.

In step S13, the low-band feature quantity extraction unit 23 extracts the low-band spectral feature quantity from the low-band spectrum supplied from the MDCT unit 21.

For example, the low-band feature quantity extraction unit 23 performs calculation according to the above equation (1) for the respective frequency bins in the low-band spectrum, to calculate the low-band pseudo amplitude spectrum.

The low-band feature quantity extraction unit 23 also reverses the obtained low-band pseudo amplitude spectrum on the high-band side at the upper limit frequency Fb, to obtain the low-band reverse pseudo amplitude spectrum. In doing so, the low-band feature quantity extraction unit 23 discards the portion at the higher frequencies than the frequency Fc in the reversed low-band pseudo amplitude spectrum, and generates the low-band reverse pseudo amplitude spectrum.

The low-band feature quantity extraction unit 23 then performs calculation according to the above equation (2) for the respective frequency bins in the low-band reverse pseudo amplitude spectrum, to calculate the SFL as the low-band spectral feature quantity.

The low-band feature quantity extraction unit 23 supplies the spectral characteristics determination unit 25 with the SFL calculated as the low-band spectral feature quantity, and also supplies the expansion coefficient calculation unit 26 with the low-band reverse pseudo amplitude spectrum.

In step S14, the high-band feature quantity extraction unit 24 extracts the high-band spectral feature quantity from the high-band spectrum supplied from the MDCT unit 21.

For example, the high-band feature quantity extraction unit 24 performs calculation according to the above equation (1) for the respective frequency bins in the high-band spectrum, to calculate the high-band pseudo amplitude spectrum. The high-band feature quantity extraction unit 24 also performs calculation according to the equation (2) for the respective frequency bins in the high-band pseudo amplitude spectrum, to calculate the SFH as the high-band spectral feature quantity.

The high-band feature quantity extraction unit 24 supplies the spectral characteristics determination unit 25 with the SFH calculated as the high-band spectral feature quantity, and also supplies the expansion coefficient calculation unit 26 with the high-band pseudo amplitude spectrum.

In step S15, in accordance with the low-band spectral feature quantity supplied from the low-band feature quantity extraction unit 23 and the high-band spectral feature quantity supplied from the high-band feature quantity extraction unit 24, the spectral characteristics determination unit 25 generates a spectral characteristic code indicating the spectral characteristics.

Specifically, in a case where both the low-band spectral feature quantity SFL and the high-band spectral feature quantity SFH are smaller than the threshold, the spectral characteristics determination unit 25 generates "1" as the value of the spectral characteristic code.

In a case where the low-band spectral feature quantity SFL and/or the high-band spectral feature quantity SFH are/is equal to or greater than the threshold, on the other hand, the spectral characteristics determination unit 25 generates "0" as the value of the spectral characteristic code.

The spectral characteristics determination unit 25 supplies the generated spectral characteristic code to the expansion coefficient calculation unit 26, the expansion coefficient quantization unit 27, and the multiplexer 28.

In step S16, in accordance with the spectral characteristic code supplied from the spectral characteristics determination unit 25, the expansion coefficient calculation unit 26 and the expansion coefficient quantization unit 27 determine whether the spectral characteristics exhibit a high tonality.

For example, in a case where the value of the spectral characteristic code is "1", the spectral characteristics are determined to exhibit a high tonality.

If the spectral characteristics are determined to exhibit a high tonality in step S16, the process moves on to step S17.

In step S17, the expansion coefficient calculation unit 26 calculates a single (one) expansion coefficient for the entire high band in accordance with the low-band reverse pseudo amplitude spectrum supplied from the low-band feature quantity extraction unit 23 and the high-band pseudo amplitude spectrum supplied from the high-band feature quantity extraction unit 24. The expansion coefficient calculation unit 26 then supplies the single expansion coefficient to the expansion coefficient quantization unit 27.

Specifically, the expansion coefficient calculation unit 26 calculates the expansion coefficient by dividing the mean value of the high-band pseudo amplitude spectrums in the respective frequency bins in the band from the upper limit frequency Fb to the frequency Fc by the mean value of the low-band reverse pseudo amplitude spectrums in the respective frequency bins.

After the expansion coefficient is calculated, the process moves on to step S19.

If the spectral characteristics are determined not to exhibit a high tonality in step S16, on the other hand, the process moves on to step S18.

In step S18, the expansion coefficient calculation unit 26 calculates expansion coefficients for the respective bands in the divided high band, in accordance with the low-band reverse pseudo amplitude spectrum supplied from the low-band feature quantity extraction unit 23 and the high-band pseudo amplitude spectrum supplied from the high-band feature quantity extraction unit 24. The expansion coefficient calculation unit 26 then supplies the expansion coefficients to the expansion coefficient quantization unit 27.

Specifically, the expansion coefficient calculation unit 26 divides the entire high band into the five bands B1 through B5 as shown in FIG. 4, for example, and performs calculation according to the above equation (4) for the respective bands, to calculate the expansion coefficients for the respective bands. In this case, one expansion coefficient is calculated for each of the bands B1 through B5.

After the expansion coefficients are calculated, the process moves on to step S19.

After the expansion coefficient(s) is (are) calculated in step S17 or step S18, the expansion coefficient quantization unit 27 in step S19 quantizes the expansion coefficient(s) supplied from the expansion coefficient calculation unit 26, and then supplies the resultant quantized expansion coefficient(s) to the multiplexer 28.

In step S20, the multiplexer 28 multiplexes the quantized low-band spectrum supplied from the spectral quantization unit 22, the spectral characteristic code supplied from the spectral characteristics determination unit 25, and the quantized expansion coefficient(s) supplied from the expansion coefficient quantization unit 27, and generates a code string. In doing so, the multiplexer 28 encodes the quantized low-band spectrum and the quantized expansion coefficient(s), and then multiplexes the encoded quantized low-band spectrum and quantized expansion coefficient(s), and the spectral characteristic code.

The multiplexer 28 outputs the code string obtained through the multiplexing, and the encoding process then comes to an end.

In the above described manner, the encoding device 11 determines the spectral characteristics of an input signal in accordance with the low-band spectral feature quantity and the high-band spectral feature quantity. The encoding device 11 then calculates the expansion coefficient(s) that varies (vary) with spectral characteristics. The expansion coefficient(s) is (are) to be used for adjusting the high-band level in the frequency region at the time of decoding.

Consequently, the level of the high band in the frequency region can be adjusted with the expansion coefficient(s) at the time of decoding, and high-band level adjustment can be performed in accordance with spectral characteristics. Thus, high-quality sound can be obtained even in a resource-poor setting, without any increase in fundamental delay.

That is, as the high-band level adjustment can be performed in the frequency region, the time delay due to the band expansion at the time of decoding can be reduced, and the increase in the resource on the decoding side can be restrained. Also, as the high-band level adjustment can be performed in accordance with spectral characteristics, sound quality degradation to the human ear can be restrained both in the case of a high-tonality signal and in the case of a low-tonality signal. Thus, high-quality sound can be obtained.

<Example Configuration of a Decoding Device>

Next, a decoding device that decodes the code string output from the encoding device 11 is described.

Figure 6:
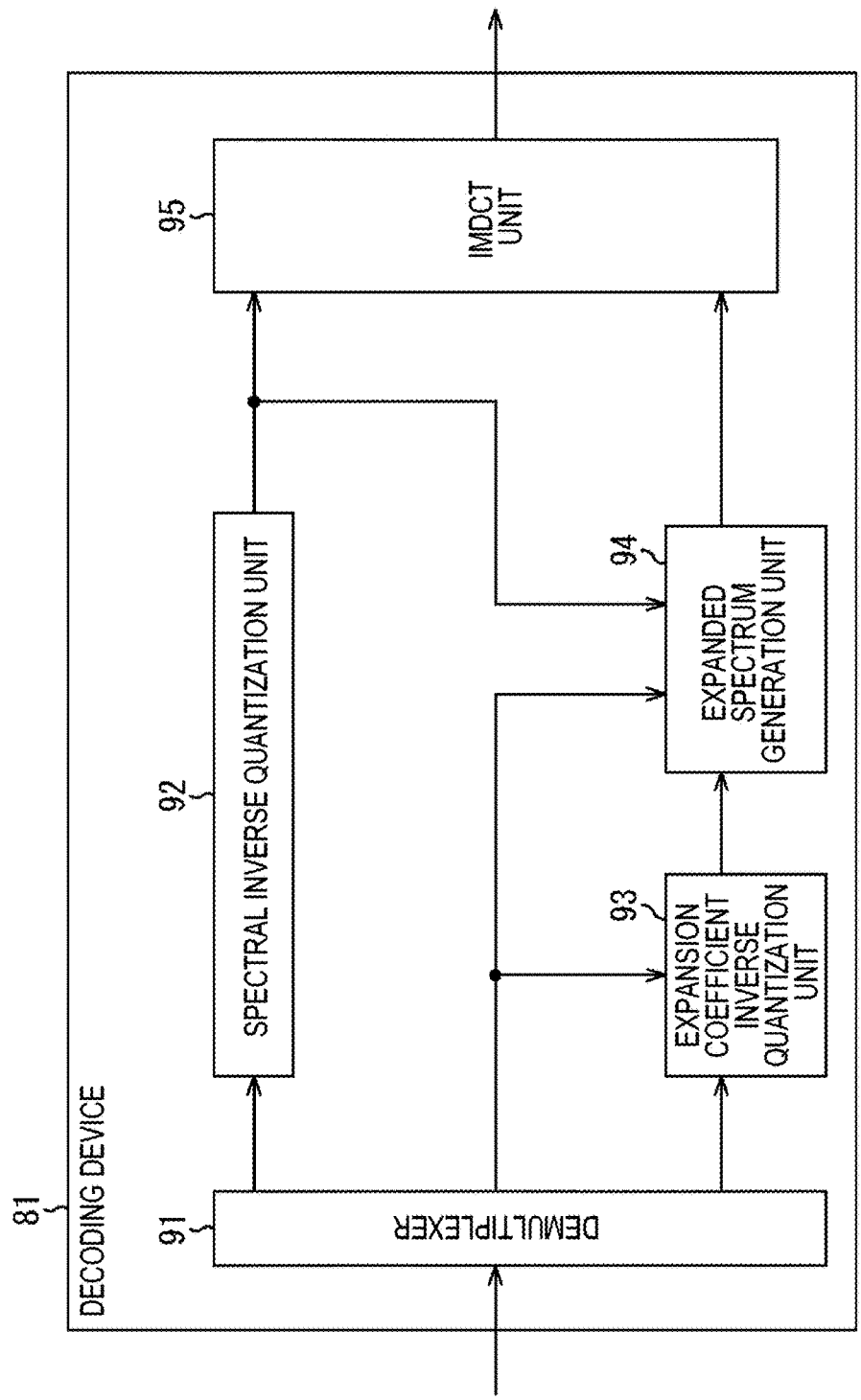
FIG. 6 is a diagram showing an example configuration of a decoding device.

FIG. 6 is a diagram showing an example configuration of an embodiment of a decoding device to which the present technology is applied.

The decoding device 81 shown in FIG. 6 includes a demultiplexer 91, a spectral inverse quantization unit 92, an expansion coefficient inverse quantization unit 93, an expanded spectrum generation unit 94, and an IMDCT unit 95.

The code string output from the multiplexer 28 of the encoding device 11 is supplied to the demultiplexer 91. The demultiplexer 91 demultiplexes the supplied code string, to obtain the quantized low-band spectrum, the spectral characteristic code, and the quantized expansion coefficient(s) from the code string. The demultiplexer 91 also decodes the quantized low-band spectrum and the quantized expansion coefficient(s).

The demultiplexer 91 supplies the quantized low-band spectrum obtained from the code string to the spectral inverse quantization unit 92, and supplies the spectral characteristic code obtained from the code string to the expansion coefficient inverse quantization unit 93 and the expanded spectrum generation unit 94. The demultiplexer 91 also supplies the quantized expansion coefficient(s) obtained from the code string to the expansion coefficient inverse quantization unit 93.

The spectral inverse quantization unit 92 inversely quantizes the quantized low-band spectrum supplied from the demultiplexer 91, and supplies the obtained low-band spectrum to the expanded spectrum generation unit 94 and the IMDCT unit 95. In accordance with the spectral characteristic code supplied from the demultiplexer 91, the expansion coefficient inverse quantization unit 93 inversely quantizes the quantized expansion coefficient(s) supplied from the demultiplexer 91, and then supplies the obtained expansion coefficient(s) to the expanded spectrum generation unit 94.

In accordance with the spectral characteristic code supplied from the demultiplexer 91, the expanded spectrum generation unit 94 generates an expanded spectrum from the expansion coefficient(s) supplied from the expansion coefficient inverse quantization unit 93 and the low-band spectrum supplied from the spectral inverse quantization unit 92. The expanded spectrum generation unit 94 then supplies the expanded spectrum to the IMDCT unit 95.

The IMDCT unit 95 regards the low-band spectrum supplied from the spectral inverse quantization unit 92 as the spectrum of the low band, and regards the expanded spectrum supplied from the expanded spectrum generation unit 94 as the spectrum of the high band (expanded band). The IMDCT unit 95 joins (combines) the low-band spectrum and the expanded spectrum to each other. The IMDCT unit 95 also performs orthogonal transform, through IMDCT, on the spectrum obtained by joining the low-band spectrum and the expanded spectrum to each other, and outputs the resultant time-series signal as the audio signal obtained through the decoding.

<Explanation of a Decoding Process>

Next, operation of the decoding device 81 is described.

When a code string is supplied, the decoding device 81 starts a decoding process, and decodes the code string, to output an audio signal. Referring now to the flowchart in FIG. 7, a decoding process to be performed by the decoding device 81 is described.

In step S51, the demultiplexer 91 demultiplexes the supplied code string, to obtain the quantized low-band spectrum, the spectral characteristic code, and the quantized expansion coefficient(s) from the code string.

The demultiplexer 91 supplies the obtained quantized low-band spectrum to the spectral inverse quantization unit 92, and supplies the spectral characteristic code to the expansion coefficient inverse quantization unit 93 and the expanded spectrum generation unit 94. The demultiplexer 91 also supplies the quantized expansion coefficient(s) to the expansion coefficient inverse quantization unit 93. More specifically, the demultiplexer 91 decodes the quantized low-band spectrum and the quantized expansion coefficient(s), and supplies the decoded quantized low-band spectrum and quantized expansion coefficient(s) to the spectral inverse quantization unit 92 and the expansion coefficient inverse quantization unit 93.

In step S52, the spectral inverse quantization unit 92 inversely quantizes the quantized low-band spectrum supplied from the demultiplexer 91, and supplies the obtained low-band spectrum to the expanded spectrum generation unit 94 and the IMDCT unit 95.

In step S53, in accordance with the spectral characteristic code supplied from the demultiplexer 91, the expansion coefficient inverse quantization unit 93 and the expanded spectrum generation unit 94 determine whether the spectral characteristics exhibit a high tonality.

For example, in a case where the value of the spectral characteristic code is "1", the spectral characteristics are determined to exhibit a high tonality. In this case, the code string includes the quantized expansion coefficient for obtaining the one (single) expansion coefficient calculated for the entire high band. Accordingly, one quantized expansion coefficient is supplied from the demultiplexer 91 to the expansion coefficient inverse quantization unit 93.

In a case where the value of the spectral characteristic code is "0", on the other hand, the spectral characteristics are determined not to exhibit a high tonality, or are determined to exhibit high noise properties. In this case, the code string includes the quantized expansion coefficients for obtaining the expansion coefficients calculated for the respective bands constituting the high band. Accordingly, the same number of quantized expansion coefficients as the number of bands in the divided high band are supplied from the demultiplexer 91 to the expansion coefficient inverse quantization unit 93.

If the spectral characteristics are determined to exhibit a high tonality in step S53, the expansion coefficient inverse quantization unit 93 in step S54 inversely quantizes the single quantized expansion coefficient supplied from the demultiplexer 91, and supplies the obtained expansion coefficient to the expanded spectrum generation unit 94.

In step S55, in accordance with the single expansion coefficient supplied from the expansion coefficient inverse quantization unit 93 and the low-band spectrum supplied from the spectral inverse quantization unit 92, the expanded spectrum generation unit 94 generates an expanded spectrum, and then supplies the expanded spectrum to the IMDCT unit 95.

Specifically, the expanded spectrum generation unit 94 reverses the low-band spectrum on the high-band side, with the boundary being the upper limit frequency Fb, as in the example described above with reference to FIG. 3. The reverse spectrum obtained as a result is used as the seed spectrum for obtaining an expanded spectrum.

The expanded spectrum generation unit 94 multiplies the entire obtained seed spectrum or the values of the seed spectrum in the respective frequency bins by the single expansion coefficient, to obtain an expanded spectrum. That is, the level of the seed spectrum is adjusted to the pre-encoding level of the original high-band spectrum with the expansion coefficient, and an expanded spectrum is obtained.

The expanded spectrum obtained as above is the high-band spectrum of the original input signal, which is estimated from the low-band spectrum and the expansion coefficient obtained through the decoding.

After the expanded spectrum is obtained, the process moves on to step S58.

If the spectral characteristics are determined not to exhibit a high tonality or are determined to exhibit high noise properties in step S53, on the other hand, the process moves on to step S56.

In step S56, the expansion coefficient inverse quantization unit 93 inversely quantizes the quantized expansion coefficients that are of the respective bands constituting the high band and are supplied from the demultiplexer 91. The expansion coefficient inverse quantization unit 93 then supplies the obtained expansion coefficients to the expanded spectrum generation unit 94. As a result, the expansion coefficients of the respective bands (regions) B1 through B5 shown in FIG. 4 are obtained, for example.

In step S57, in accordance with the expansion coefficients of the respective bands supplied from the expansion coefficient inverse quantization unit 93 and the low-band spectrum supplied from the spectral inverse quantization unit 92, the expanded spectrum generation unit 94 generates an expanded spectrum, and then supplies the expanded spectrum to the IMDCT unit 95.

Specifically, the expanded spectrum generation unit 94 generates a seed spectrum by performing a procedure similar to that in step S55, and multiplies the respective bands (regions) in the obtained seed spectrum by the expansion coefficients of these bands, to obtain an expanded spectrum.

In a case where the high band is divided into the five bands B1 through B5 as shown in FIG. 4, for example, the portion of the band B1 in the seed spectrum, or more particularly, the values of the seed spectrum in the respective frequency bins in the band B1 are multiplied by the expansion coefficient of the band B1, and the portion of the band B1 in the expanded spectrum is generated. As for the other bands B2 through B5, these bands in the seed spectrum are multiplied by the expansion coefficients of the respective bands in a manner similar to the above, and thus, the portions of the respective bands in the expanded spectrum are generated.

After the expanded spectrum is obtained, the process moves on to step S58.

It should be noted that, although the low-band spectrum is reversed on the high-band side and is turned into the seed spectrum in steps S55 and S57, the seed spectrum is generated not necessary in the above manner, and may be generated in any appropriate manner. For example, the portion of a frequency band in the low-band spectrum may be duplicated (copied), and be pasted to the high band. The spectrum obtained in such a manner may be used as the seed spectrum.

After the expanded spectrum is generated in step S55 or S57, the IMDCT unit 95 in step S58 generates a time-series signal in accordance with the low-band spectrum supplied from the spectral inverse quantization unit 92 and the expanded spectrum supplied from the expanded spectrum generation unit 94.

Specifically, the IMDCT unit 95 joins (combines) the low-band spectrum and the expanded spectrum to each other, to generate a spectrum including all the band components of the low band and the high band (expanded band). The IMDCT unit 95 further performs IMDCT on the spectrum obtained through the joining, and thus obtains a time-series signal. In this manner, a time-series signal to which the high-band component is added through a band expansion is obtained.

The IMDCT unit 95 outputs the obtained time-series signal as the audio signal obtained through the decoding, and the decoding process then comes to an end.

In the above described manner, the decoding device 81 obtains the expansion coefficient(s) corresponding to spectral characteristics by performing decoding and inverse quantization. and then generates an expanded spectrum from the obtained expansion coefficient(s) and the seed spectrum obtained by reversing the low-band spectrum on the high-band side.

In this manner, the level of the seed spectrum as the high-band component is adjusted with the expansion coefficient(s) corresponding to spectral characteristics, and an expanded spectrum is obtained. Thus, the level of the high band in the frequency region can be adjusted, and high-band level adjustment can be performed in accordance with spectral characteristics.

Consequently, high-quality sound can be obtained even in a resource-poor setting, without any increase in fundamental delay. That is, as the level adjustment is performed in the frequency region, the time delay due to the band expansion at the time of decoding can be reduced, and the increase in the resource can also be restrained. Also, sound quality degradation to the human ear due to the band expansion is restrained both in the case of a high-tonality signal and in the case of a low-tonality signal, and thus, sound with higher quality can be obtained.

<Expanded Spectrum Generation>

The expanded spectrum generation by the expanded spectrum generation unit 94 of the decoding device 81 is now described in greater detail.

As described above, in accordance with the spectral characteristic code, the expanded spectrum generation unit 94 determines whether the original signal prior to the encoding is a signal with a high tonality or whether the original signal is a normal signal with high noise properties. The expanded spectrum generation unit 94 then generates an expanded spectrum.

Figure 8:
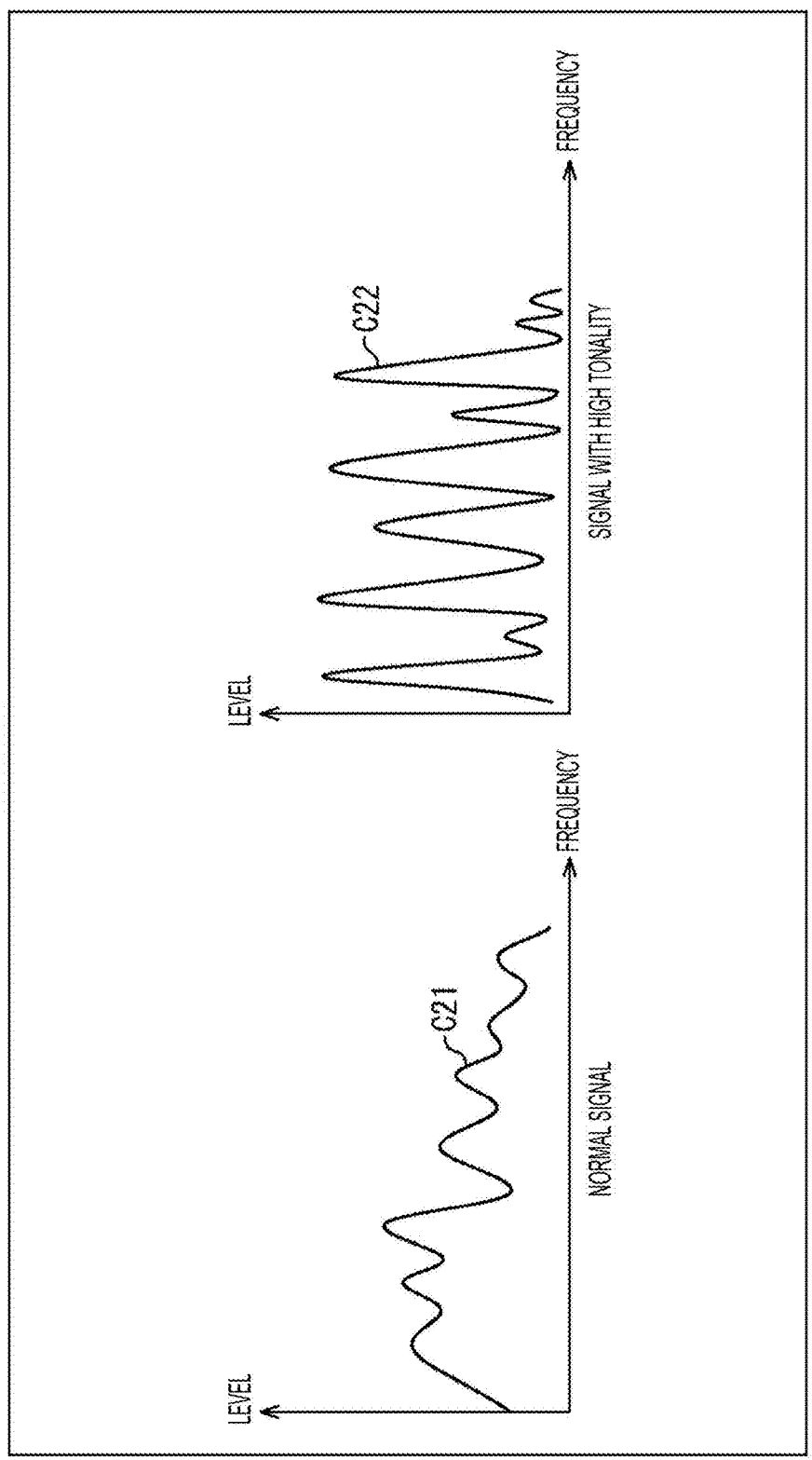
FIG. 8 is a graph for explaining a high-tonality signal.

For example, as shown in FIG. 8, a signal with a high tonality and a normal signal with high noise properties differ in signal spectrum shape. It should be noted that the ordinate axis in FIG. 8 indicates spectral value or level, and the abscissa axis indicates frequency.

In FIG. 8, a curve C21 represents the spectrum of a signal with high noise properties or a normal signal, and a curve C22 represents the spectrum of a signal with a high tonality.

The signal with high noise properties represented by the curve C21 does not have any portion at an exceedingly high level in the entire frequency band, and the waveform of the spectrum has portions with gently-curved, mountain-like shapes. That is, the signal with high noise properties does not have any portion at which energy concentrates.

On the other hand, the signal with a high tonality represented by the curve C22 has energy concentrating at certain frequencies, and the shapes of the waveform at these portions are like sharply peaked mountains. That is, the waveform of the spectrum of the signal with a high tonality sharply protrudes at the frequencies at which energy concentrates, and the spectrum of the signal does not have a gently curved waveform.

Also, when an expanded spectrum is generated, a spectrum obtained from the low-band spectrum, such as a spectrum generated by reversing the low-band spectrum at the upper limit frequency Fb or a spectrum generated by partially duplicating the low-band spectrum and pasting the duplicate to the high band, is used as the seed spectrum. This seed spectrum is then subjected to level adjustment with the expansion coefficient(s) or to amplitude adjustment. In this manner, the seed spectrum is turned into an expanded spectrum.

Here, in the signal with high noise properties, the phase relationship between adjacent spectrums is not so important to the human ear. What really matters to the human ear is the amplitude level. Therefore, when the level of the seed spectrum is adjusted, the level adjustment is preferably performed by the minute unit so that the level (amplitude) of the seed spectrum becomes closer to the level of the high-band spectrum of the original signal prior to the encoding.

Figure 9:
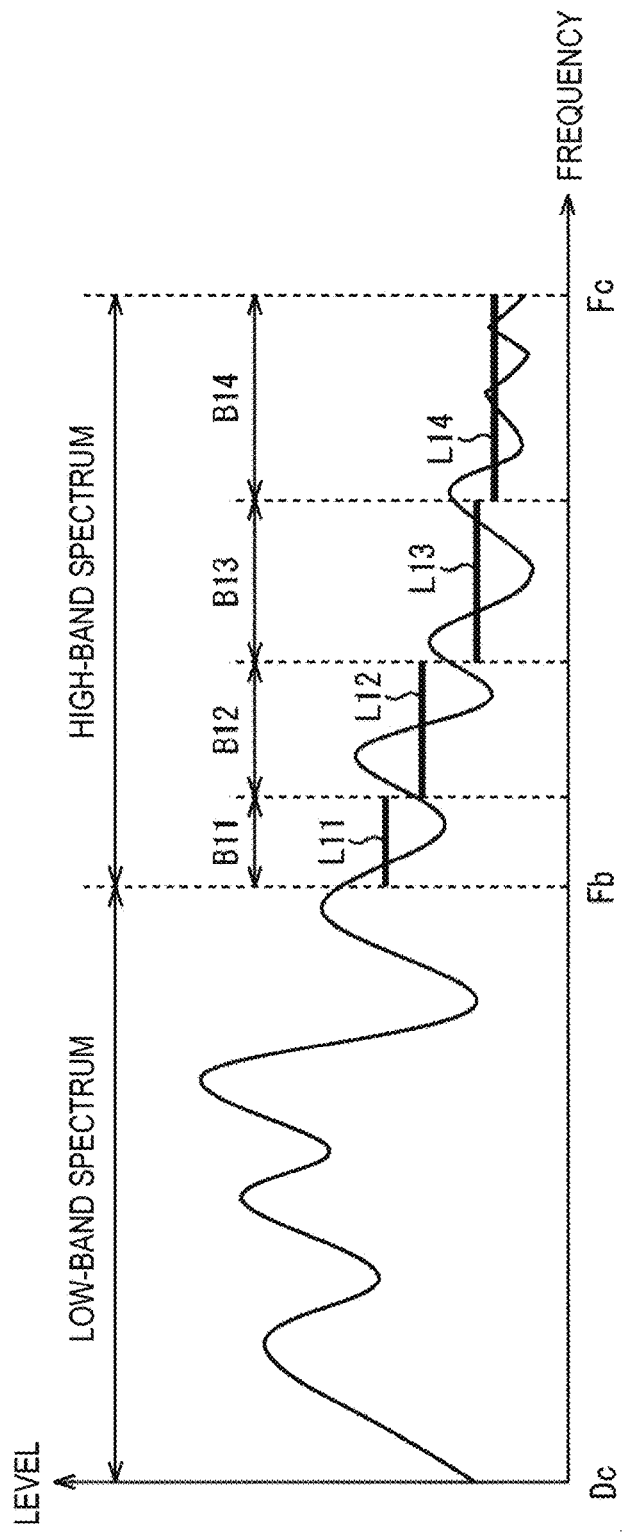
FIG. 9 is a graph for explaining the mean value of high-band pseudo amplitude spectrums.

That is, at the time of encoding, the high band is divided into four bands as shown in FIG. 9, for example, and expansion coefficients are calculated for the respective bands. It should be noted that the ordinate axis in FIG. 9 indicates spectral value or level, and the abscissa axis indicates frequency.

In this example, the frequency band of the high-band spectrum, or the frequency band that is the high band from the upper limit frequency Fb to the frequency Fc, is divided into four bands (regions) B11 through B14. Further, the width of a band obtained through the division is greater at a portion closer to the frequency Fc.

In such a case, when the input signal is encoded, the mean value of the high-band pseudo amplitude spectrums in each of the bands B11 through B14 is calculated. In this example, straight lines L11 through L14 represent the mean values of the high-band pseudo amplitude spectrums in the bands B11 through B14, respectively, or represent the mean amplitudes of the high-band spectrum.

Also, the mean values of the high-band pseudo amplitude spectrums calculated for the respective bands are divided by the mean values of the low-band reverse pseudo amplitude spectrums in the corresponding bands, and the obtained values are stored as expansion coefficients into a code string that is then transmitted to the decoding device 81.

Figure 10:
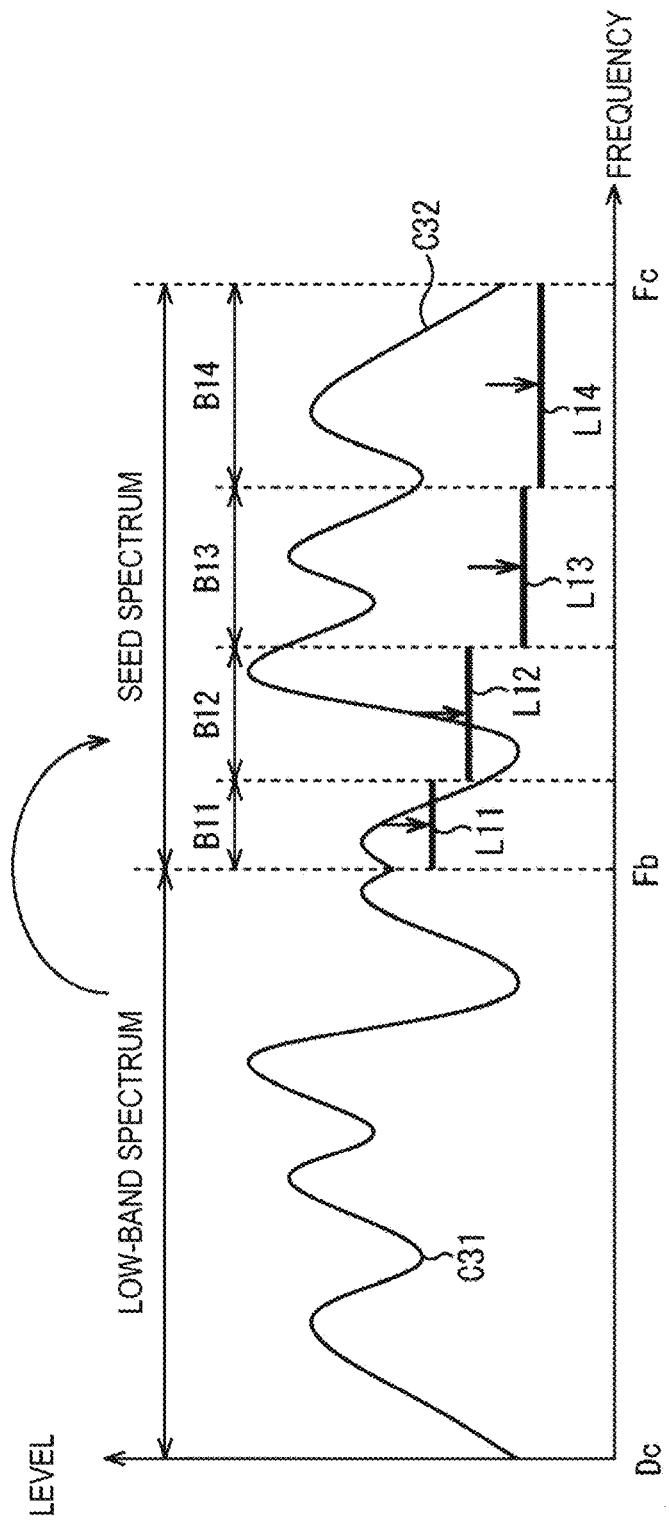
FIG. 10 is a graph for explaining expanded spectrum level adjustment.

In the decoding device 81, the seed spectrum obtained from the low-band spectrum is then subjected to level adjustment with the expansion coefficients, as shown in FIG. 10. It should be noted that the ordinate axis in FIG. 10 indicates spectral value or level, and the abscissa axis indicates frequency. Also, in FIG. 10, the components equivalent to those shown in FIG. 9 are denoted by the same reference numerals as those used in FIG. 9, and explanation of them will not be unnecessarily repeated.

In FIG. 10, a curve C31 represents the low-band spectrum obtained through decoding of the code string, and a curve C32 represents the seed spectrum obtained from the low-band spectrum.

In this example, the low-band spectrum represented by the curve C31 is reversed on the high-band side at the upper limit frequency Fb, and is turned into the seed spectrum represented by a curve C32.

The respective bands B11 through B14 in such a seed spectrum are multiplied by the expansion coefficients calculated for the respective bands. In this manner, the level of the seed spectrum is adjusted in the respective bands B11 through B14, so that the levels of the respective bands in the seed spectrum, or more particularly, the mean amplitudes of the respective bands, become closer to the mean amplitudes of the high-band spectrum of the original signal, as indicated by arrows.

However, in a case where the low-band spectrum is a signal with a high tonality, if the respective bands in the seed spectrum are multiplied by different expansion coefficients, the levels of the respective bands in the expanded spectrum, or the mean amplitudes, become closer to the mean amplitudes of the original high-band spectrum prior to the encoding, but the phase relationships between the spectrums are greatly disturbed in the respective bands.

Figure 11:
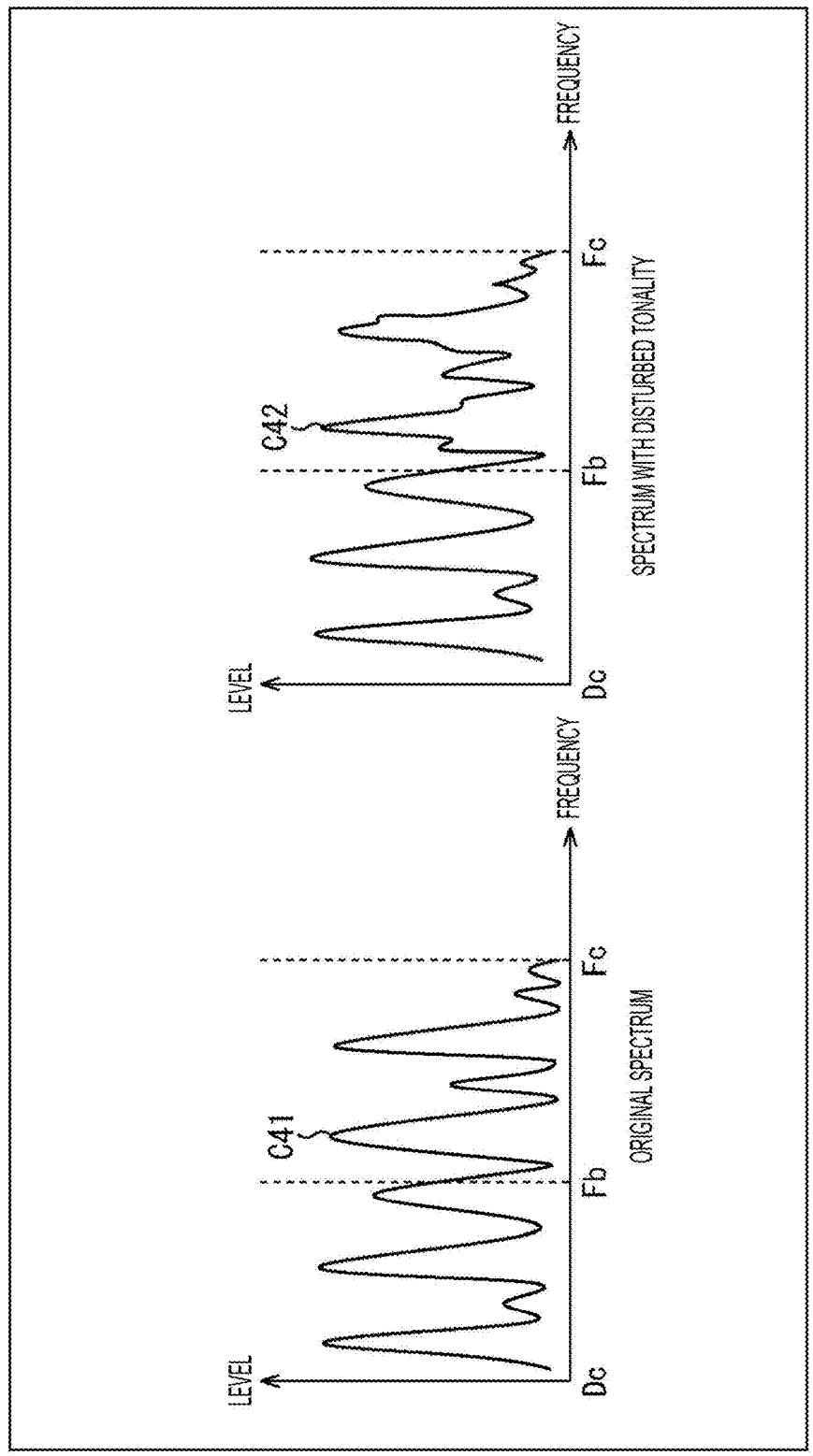
FIG. 11 is a graph for explaining tonality disturbed due to level adjustment.

As a result, the tonality of the expanded spectrum is lost as shown in FIG. 11, for example. It should be noted that the ordinate axis in FIG. 11 indicates spectral value or level, and the abscissa axis indicates frequency.

In this example, a curve C41 represents the MDCT spectrum of the current encoded input signal, and a curve C42 represents the spectrum obtained by combining the low-band spectrum and the expanded spectrum generated at the time of decoding of the current encoded input signal. Therefore, in the spectrum represented by the curve C42 in this example, the portion from the frequency Dc to the upper limit frequency Fb is the low-band spectrum, and the portion from the upper limit frequency Fb to the frequency Fc is the expanded spectrum.

In this example, the original input signal is a signal that has a high tonality both in the low band and in the high band. If the level of the seed spectrum is adjusted with different expansion coefficients among the respective bands in the high band at the time of decoding of such an input signal, the spectrum phase relationship is greatly disturbed as indicated by the curve C42, and the tonality of the expanded band is lost.

In the spectrum represented by the curve C42, the high-band portion or the waveform of the expanded spectrum is disturbed, and the tonality of the original MDCT spectrum is lost. Particularly, at the boundaries between the bands in the divided high band, the waveform is easily disturbed, and the tonality is likely to be lost.

While the seed spectrum obtained by reversing the low-band spectrum is in the normal state or in the state prior to the level adjustment with the expansion coefficients, the spectrum phase relationship is maintained, and accordingly, the tonality is also maintained.

However, the expanded spectrum cannot be made to reflect the amplitude level of the high-band spectrum of the original input signal, unless the level (amplitude) of the seed spectrum is adjusted. In that case, the volume of sound in the high band or in the expanded band differs from the volume of sound in the original high band. As a result, an appropriate band expansion cannot be achieved. In other words, sound with higher quality cannot be obtained.

In view of this, seed spectrum level adjustment by the smallest possible unit is performed on a signal with a high tonality according to the present technology, to maintain the tonality in the expanded spectrum and cause the expanded spectrum to reflect the amplitude level.

Specifically, at the time of encoding, the expansion coefficient calculation unit 26 divides the mean value of the high-band pseudo amplitude spectrums in the entire high band (expanded band) by the mean value of the low-band reverse pseudo amplitude spectrums in the entire high band, to calculate a single expansion coefficient for the expanded band.

Meanwhile, at the time of decoding, the expanded spectrum generation unit 94 multiplies the entire seed spectrum by the single expansion coefficient, to obtain an expanded spectrum. That is, with the entire expanded band (high band) being the unit, the seed spectrum level adjustment is performed, and an expanded spectrum is obtained.

Figure 12:
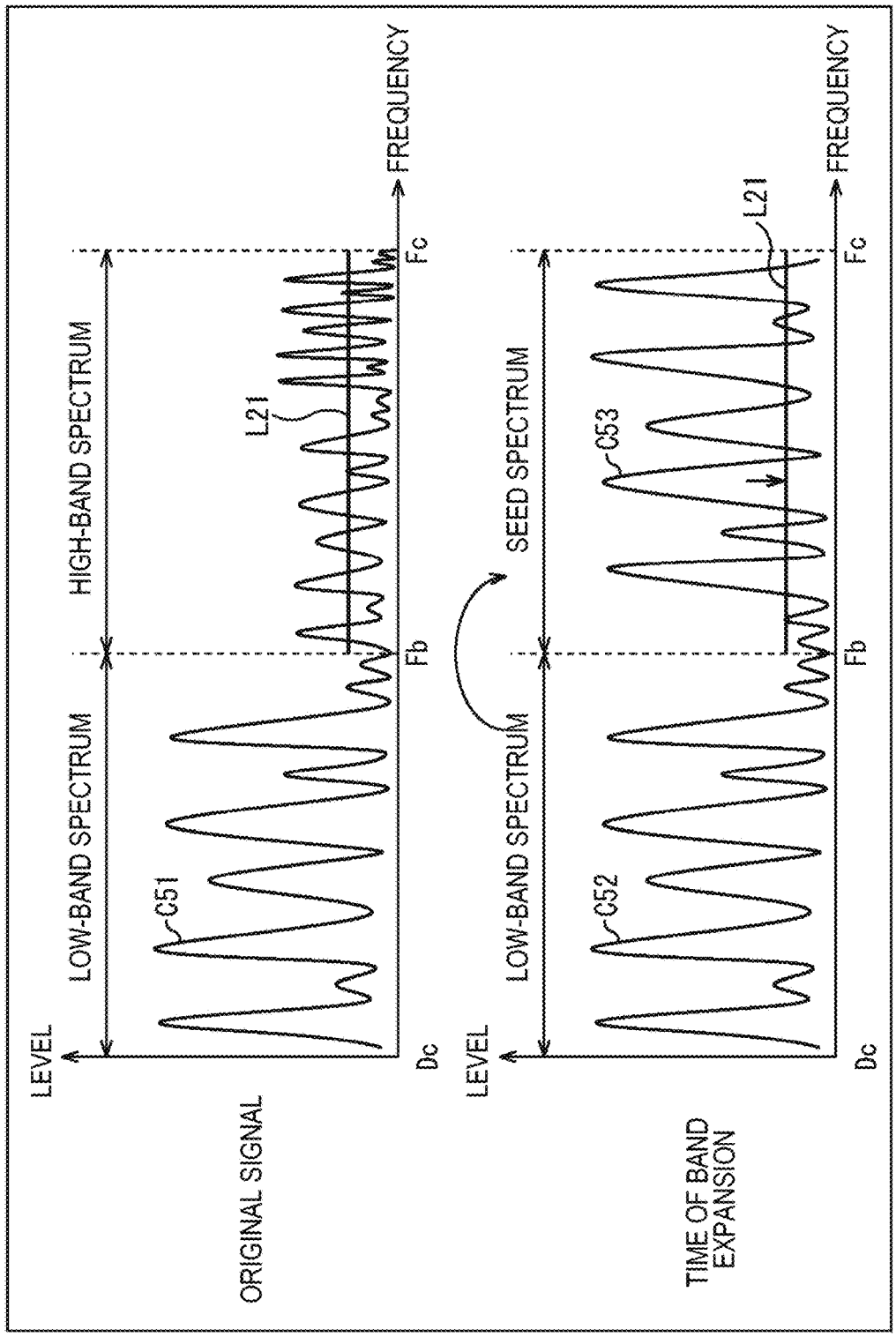
FIG. 12 is a graph for explaining expanded spectrum level adjustment.

As the level adjustment is performed on the expanded band basis in the above manner, the amplitude level of the entire high band of the expanded spectrum can be made closer to the amplitude level of the high band of the original input signal, while the tonality of the input signal is maintained, as shown in FIG. 12, for example. It should be noted that the ordinate axis in FIG. 12 indicates spectral value or level, and the abscissa axis indicates frequency.

In FIG. 12, curves C51 through C53 represent the MDCT spectrum of the original input signal, the low-band spectrum obtained through the inverse quantization at the time of decoding, and the seed spectrum, respectively.

In this example, the low-band portion and the high-band portion of the MDCT spectrum represented by the curve C51, or the low-band spectrum and the high-band spectrum, each have portions at which energy concentrates at certain frequencies, and a signal with a high tonality is maintained. Also, in the MDCT spectrum represented by the curve C51, the mean amplitude of the low-band spectrum is higher than the mean amplitude of the high-band spectrum.

For the high-band spectrum of such an MDCT spectrum, the mean value of the high-band pseudo amplitude spectrums in the entire band of the high-band spectrum is determined, and a signal expansion coefficient is calculated at the time of encoding. In FIG. 12, a straight line L21 represents the mean value of the high-band pseudo amplitude spectrums in the high band (expanded band), or the mean amplitude of the high-band spectrum.

Meanwhile, at the time of decoding, the low-band spectrum represented by the curve C52 is reversed, to obtain the seed spectrum represented by the curve C53. This seed spectrum is subjected to level adjustment with the expansion coefficient as indicated by the arrow in the drawing, and is turned into an expanded spectrum.

At this point, by virtue of the single expansion coefficient, the mean amplitude of the entire high band of the expanded spectrum is made closer to the mean value of the high-band pseudo amplitude spectrums represented by the straight line L21. In this manner, the levels of the respective frequencies in the seed spectrum are adjusted by the same amount, and the phase relationship is not disturbed. That is, the amplitude level can be appropriately adjusted, while the tonality is maintained. As a result, sound with higher quality can be obtained.

Also, as the single expansion coefficient is used, the amount of additional information that is stored in the code string to be output from the encoding device 11 and is necessary for a band expansion can be reduced. Accordingly, the equivalent amount of information can be allocated to the quantization of the low-band spectrum, and an increase in the entire sound quality can be expected.

Second Embodiment

<Expanded Spectrum Generation with Random Noise>

In a case where the tonality of the low band of an input signal is high, the tonality of the high band of the input signal is normally likely to be also high. Therefore, in the encoding process described above, when both the low-band spectral feature quantity and the high-band spectral feature quantity are smaller than the threshold, the current input signal to be encoded has spectral characteristics exhibiting a high tonality.

Figure 13:
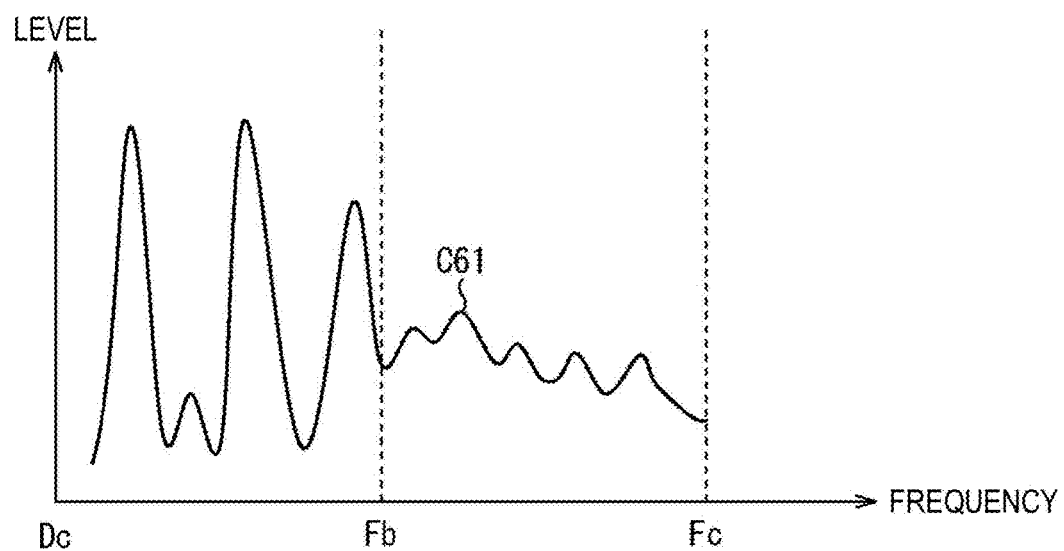
FIG. 13 is a graph showing an example signal that has a high tonality in the low band, and has a low tonality in the high band.

However, as shown in FIG. 13, for example, there is an input signal having spectral characteristics that exhibit a high tonality in the low-band spectrum and a low tonality in the high-band spectrum, though such an input signal is not often generated. It should be noted that the ordinate axis in FIG. 13 indicates spectral value or level, and the abscissa axis indicates frequency.

In FIG. 13, a curve C61 represents the MDCT spectrum of the current input signal to be encoded. Specifically, in this MDCT spectrum, the portion from the frequency Dc to the upper limit frequency Fb is the low-band spectrum, and the portion from the upper limit frequency Fb to the frequency Fc is the high-band spectrum.

For example, the low-band spectrum has portions at which energy concentrates at certain frequencies, and the signal has a high tonality in the low-band spectrum. On the other hand, the high-band spectrum does not have any portion at which energy concentrates at a certain frequency, and the signal has a low tonality or high noise properties in the high-band spectrum.

Figure 14:
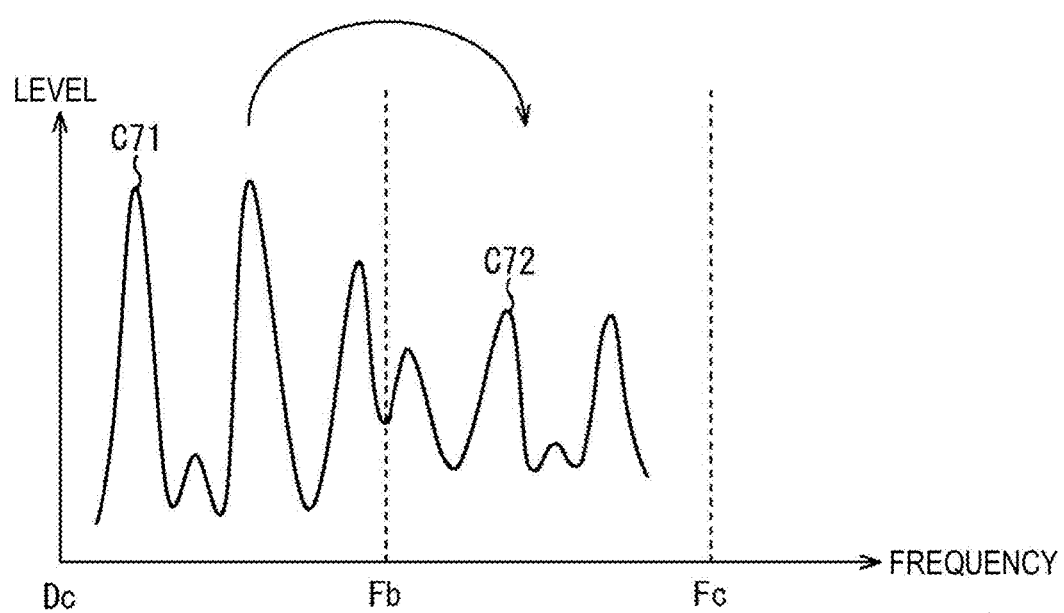
FIG. 14 is a graph for explaining expanded spectrum generation and sound quality degradation.

Such an input signal that has a high tonality in the low band but has a low tonality in the high band is encoded, and a band expansion is to be performed at the time of decoding. A seed spectrum is then generated by reversing or partially duplicating the low-band spectrum, and an expanded spectrum is generated from the seed spectrum. In such a case, the expanded spectrum has a high tonality, instead of the intended noise properties, as shown in FIG. 14, for example. It should be noted that the ordinate axis in FIG. 14 indicates spectral value or level, and the abscissa axis indicates frequency.

In this example, a curve C71 represents the low-band spectrum obtained by inversely quantizing the quantized low-band spectrum, and a curve C72 represents the expanded spectrum.

In this example, the tonality is low in the high-band spectrum of the original time-series signal, but the tonality is high in the low-band spectrum. Accordingly, the tonality is high in the expanded spectrum obtained by reversing the low-band spectrum and performing level adjustment with an expansion coefficient. That is, due to a band expansion, different characteristics from the characteristics of the intended signal are observed in the high band.

When an unintended high tonality appears in the high band, the time-series signal (audio signal) obtained through a decoding process sometimes sounds metallic to the human ear, causing a feeling of strangeness.

Figure 15:
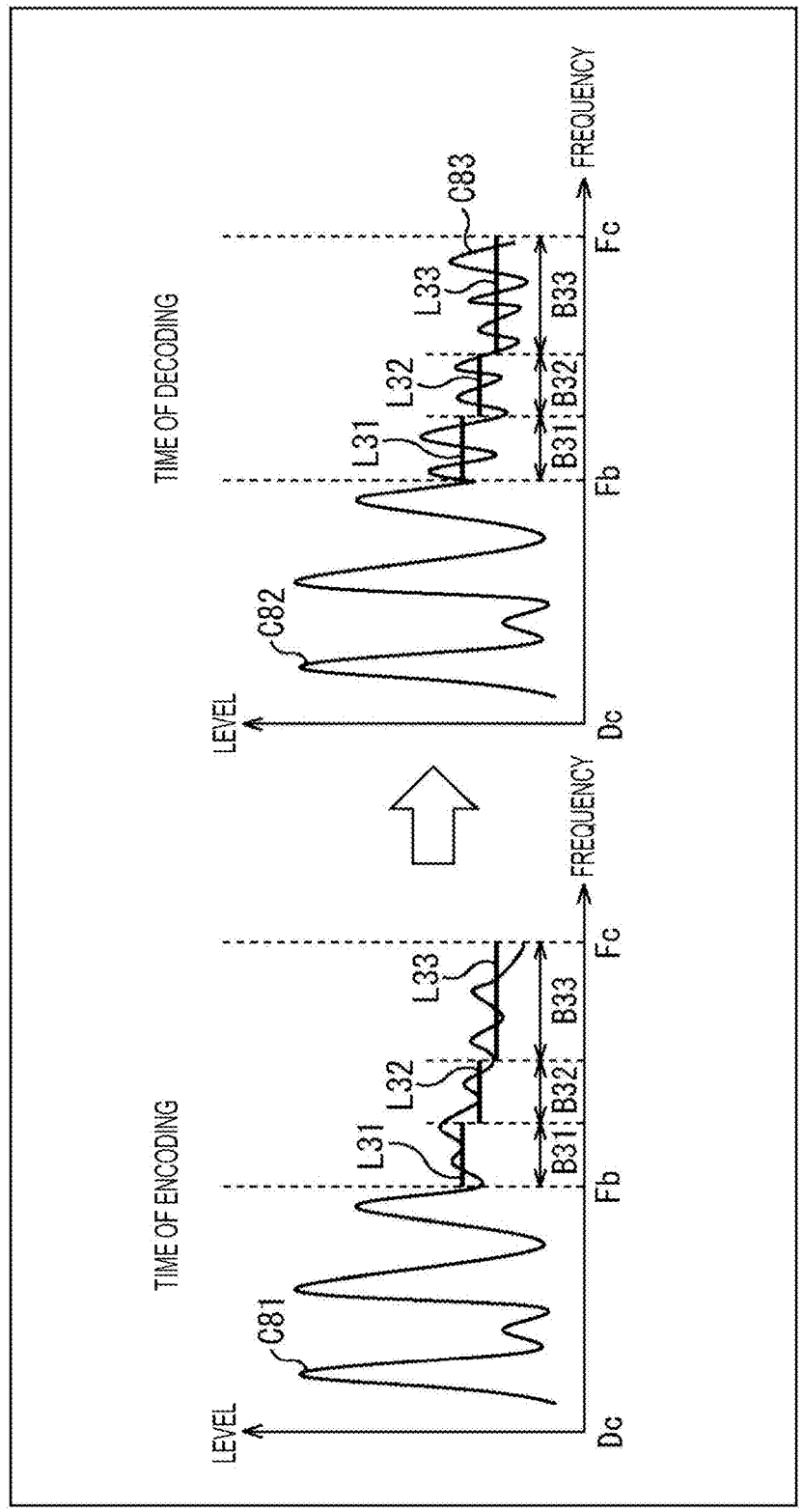
FIG. 15 is a graph for explaining envelope coefficients and expanded spectrum generation.

In view of this, in a case where the tonality is high in the low-band spectrum while the tonality is low in the high-band spectrum, a seed spectrum obtained by reversing the low-band spectrum is not used, and an expanded spectrum may be generated with the use of random noise as shown in FIG. 15, for example. It should be noted that the ordinate axis in FIG. 15 indicates spectral value or level, and the abscissa axis indicates frequency.

In FIG. 15, curves C81 through C83 represent the MDCT spectrum, the low-band spectrum obtained through the inverse quantization performed on the quantized low-band spectrum, and the expanded spectrum, respectively.

In this example, the high band of the MDCT spectrum is divided into three bands B31 through B33, and a band with a higher frequency has a greater bandwidth. As the high band is divided into the bands B31 through B33, envelope coefficients are calculated as envelope information indicating the envelopes of the respective bands at the time of encoding. For example, an envelope coefficient is the mean value of the high-band pseudo amplitude spectrums in the respective frequency bins in the current band being subjected to calculation.

In FIG. 15, straight lines L31 through L33 represent the envelope coefficients calculated for the bands B31 through B33, respectively.

An envelope coefficient is expansion coefficient information for adjusting the level of random noise as a noise signal at the time of expanded spectrum generation. However, the expansion coefficient information is referred to as the envelope coefficient in this example, to be distinguished from an expansion coefficient calculated from a low-band reverse pseudo amplitude spectrum and a high-band pseudo amplitude spectrum. It should be noted that the number of divisional bands in the divided high band at the time of envelope coefficient calculation may be equal to or different from the number of divisional bands in the divided high band at the time of expansion coefficient calculation.

After the envelope coefficients are calculated, the envelope coefficients are quantized and encoded, and are multiplexed with the quantized low-band spectrum and the spectral characteristic code. Thus, a code string is generated.

Meanwhile, on the decoding side that has received the supply of the code string, an expanded spectrum is generated with the use of the envelope coefficients and the random noise obtained from the code string.

Specifically, at the time of decoding, random numbers normalized to values in the range of −1.0 to 1.0 are generated for the respective frequency bins in the bands B31 through B33 in the expanded band, and a noise signal formed with the random numbers of the respective frequency bins is regarded as the random noise. The random noise is then multiplied by the envelope coefficients, and thus, an expanded spectrum is generated.

The expanded spectrum obtained in this manner is generated from the random noise obtained by normalizing random numbers. Therefore, energy does not concentrate at certain frequencies, as indicated by the curve C83, and a spectrum with high noise properties is maintained. Also, the expanded spectrum is obtained by performing level adjustment on the random noise with the envelope coefficients. Consequently, the envelope of the expanded spectrum is similar to the envelope of the high band of the original MDCT spectrum.

Accordingly, the time-series signal obtained through the decoding has a high tonality in the low-band spectrum and has a low tonality in the high-band spectrum, like the encoded original input signal.

<Explanation of an Encoding Process>

Next, the encoding process to be performed by the encoding device 11 when the above described envelope coefficients are generated is described.

Figure 16:
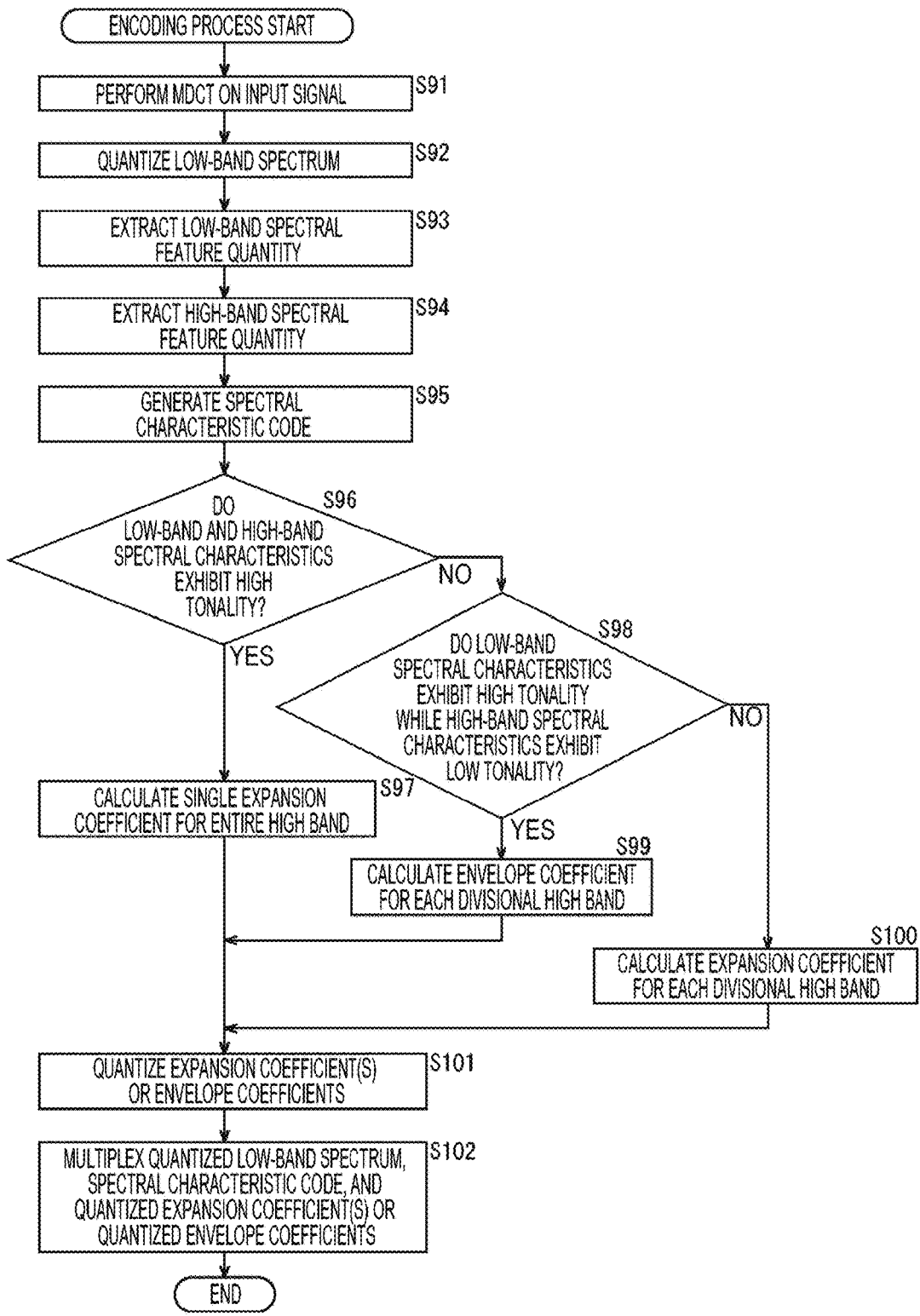
FIG. 16 is a flowchart for explaining an encoding process.

Referring now to the flowchart in FIG. 16, the encoding process to be performed by the encoding device 11 is described. It should be noted that the procedures in steps S91 through S94 are similar to the procedures in steps S11 through S14 in FIG. 5, and therefore, explanation of them is not repeated herein.

In step S95, in accordance with the low-band spectral feature quantity supplied from the low-band feature quantity extraction unit 23 and the high-band spectral feature quantity supplied from the high-band feature quantity extraction unit 24, the spectral characteristics determination unit 25 generates a spectral characteristic code indicating the spectral characteristics.

Specifically, in a case where both the low-band spectral feature quantity SFL and the high-band spectral feature quantity SFH are smaller than the threshold, the spectral characteristics determination unit 25 generates "1" as the value of the spectral characteristic code. The spectral characteristic code "1" indicates that both the low band and the high band of the input signal (MDCT spectrum) have a high tonality as the spectral characteristics.

Also, in a case where the low-band spectral feature quantity SFL is smaller than the threshold while the high-band spectral feature quantity SFH is equal to or greater than the threshold, the spectral characteristics determination unit 25 generates "2" as the value of the spectral characteristic code. The spectral characteristic code "2" indicates that the low band (low-band spectrum) of the input signal has a high tonality, and the high band (high-band spectrum) of the input signal has a low tonality or high noise properties.

Further, in a case where the low-band spectral feature quantity SFL is equal to or greater than the threshold, the spectral characteristics determination unit 25 generates "0" as the value of the spectral characteristic code. The spectral characteristic code "0" indicates that the input signal has a low tonality as the spectral characteristics.

The spectral characteristics determination unit 25 supplies the generated spectral characteristic code to the expansion coefficient calculation unit 26, the expansion coefficient quantization unit 27, and the multiplexer 28.

In step S96, in accordance with the spectral characteristic code supplied from the spectral characteristics determination unit 25, the expansion coefficient calculation unit 26 and the expansion coefficient quantization unit 27 determine whether the spectral characteristics of both the low band and the high band exhibit a high tonality.

For example, in a case where the value of the spectral characteristic code is "1", the spectral characteristics of the low band and the high band are determined to exhibit a high tonality.

If the spectral characteristics of the low band and the high band are determined to exhibit a high tonality in step S96, the process moves on to step S97.

In step S97, the expansion coefficient calculation unit 26 calculates a single expansion coefficient for the entire high band in accordance with the low-band reverse pseudo amplitude spectrum supplied from the low-band feature quantity extraction unit 23 and the high-band pseudo amplitude spectrum supplied from the high-band feature quantity extraction unit 24. The expansion coefficient calculation unit 26 then supplies the single expansion coefficient to the expansion coefficient quantization unit 27.

Figure 5:
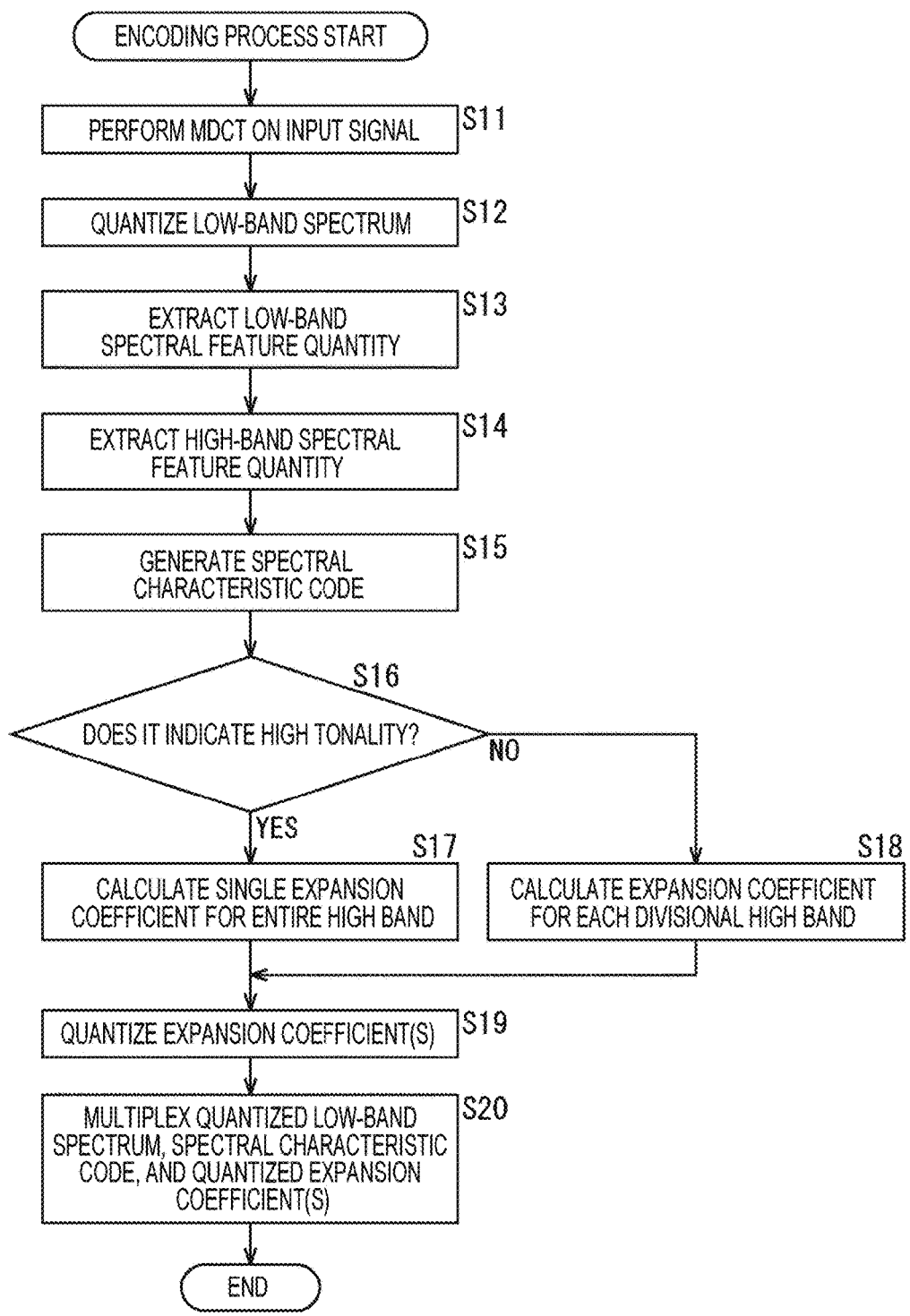
FIG. 5 is a flowchart for explaining an encoding process.

It should be noted that, in step S97, a procedure similar to the procedure in step S17 in FIG. 5 is carried out. After the expansion coefficient is calculated in step S97, the process moves on to step S101.

If the spectral characteristics of the low band and the high band are determined not to exhibit a high tonality in step S96, on the other hand, the process moves on to step S98.

In step S98, in accordance with the spectral characteristic code, the expansion coefficient calculation unit 26 and the expansion coefficient quantization unit 27 determine whether the spectral characteristics of the low band exhibit a high tonality while the spectral characteristics of the high band exhibit a low tonality.

For example, in a case where the value of the spectral characteristic code is "2", the spectral characteristics of the low band are determined to exhibit a high tonality, and the spectral characteristics of the high band are determined to exhibit a low tonality.

If the spectral characteristics of the low band are determined to exhibit a high tonality while the spectral characteristics of the high band are determined to exhibit a low tonality in step S98, the process moves on to step S99.

In step S99, the expansion coefficient calculation unit 26 calculates envelope coefficients for the respective bands in the divided high band, in accordance with the high-band pseudo amplitude spectrum supplied from the high-band feature quantity extraction unit 24. The expansion coefficient calculation unit 26 then supplies the envelope coefficients to the expansion coefficient quantization unit 27.

Specifically, the expansion coefficient calculation unit 26 divides the entire high band into the three bands B31 through B33 as shown in FIG. 15, for example, and calculates the mean values of the high-band pseudo amplitude spectrums in the frequency bins in the respective bands as the envelope coefficients of the respective bands.

After the envelope coefficients are calculated, the process moves on to step S101.

If the spectral characteristics of the low band are determined not to exhibit a high tonality while the spectral characteristics of the high band are determined not to exhibit a low tonality in step S98, on the other hand, the process moves on to step S100.

In step S100, the expansion coefficient calculation unit 26 calculates expansion coefficients for the respective bands in the divided high band, in accordance with the low-band reverse pseudo amplitude spectrum supplied from the low-band feature quantity extraction unit 23 and the high-band pseudo amplitude spectrum supplied from the high-band feature quantity extraction unit 24. The expansion coefficient calculation unit 26 then supplies the expansion coefficients to the expansion coefficient quantization unit 27. It should be noted that, in step S100, a procedure similar to the procedure in step S18 in FIG. 5 is carried out. After the expansion coefficients are calculated in step S100, the process moves on to step S101.

After the expansion coefficient(s) is (are) calculated in step S97 or step S100, or after the envelope coefficients are calculated in step S99, the expansion coefficient quantization unit 27 in step S101 quantizes the expansion coefficient (s) or the envelope coefficients supplied from the expansion coefficient calculation unit 26.

Specifically, in a case where the procedure in step S97 or S100 is carried out, and the expansion coefficient(s) is (are) supplied, the expansion coefficient quantization unit 27 quantizes the expansion coefficient(s), and supplies the resultant quantized expansion coefficient(s) to the multiplexer 28. Also, in a case where the procedure in step S99 is carried out, and the envelope coefficients are supplied, the expansion coefficient quantization unit 27 quantizes the envelope coefficients, and supplies the resultant quantized envelope coefficients to the multiplexer 28. In this step, scalar quantization or vector quantization is performed on the expansion coefficient(s) or the envelope coefficients, for example.

In step S102, the multiplexer 28 multiplexes the quantized low-band spectrum supplied from the spectral quantization unit 22, the spectral characteristic code supplied from the spectral characteristics determination unit 25, and the quantized expansion coefficient(s) or the quantized envelope coefficients supplied from the expansion coefficient quantization unit 27, and generates a code string. In this step, the multiplexer 28 performs the multiplexing after encoding the quantized low-band spectrum, and the quantized expansion coefficient(s) or the quantized envelope coefficients.

The multiplexer 28 outputs the code string obtained through the multiplexing, and the encoding process then comes to an end.

In the above described manner, the encoding device 11 determines the spectral characteristics of an input signal in accordance with the low-band spectral feature quantity and the high-band spectral feature quantity. In accordance with the spectral characteristics, the encoding device 11 calculates the expansion coefficient(s) or the envelope coefficients as the information to be used for obtaining an expanded spectrum at the time of decoding.

In this manner, an appropriate expanded spectrum can be obtained with the use of the expansion coefficient(s) or the envelope coefficients at the time of decoding, and high-quality sound can be obtained even in a resource-poor setting, without any increase in fundamental delay. Particularly, in a case where an expanded spectrum is generated with the use of the envelope coefficients, an expanded spectrum that has a low tonality even when the tonality is high in the low-band spectrum can be obtained.

<Explanation of a Decoding Process>

Figure 17:
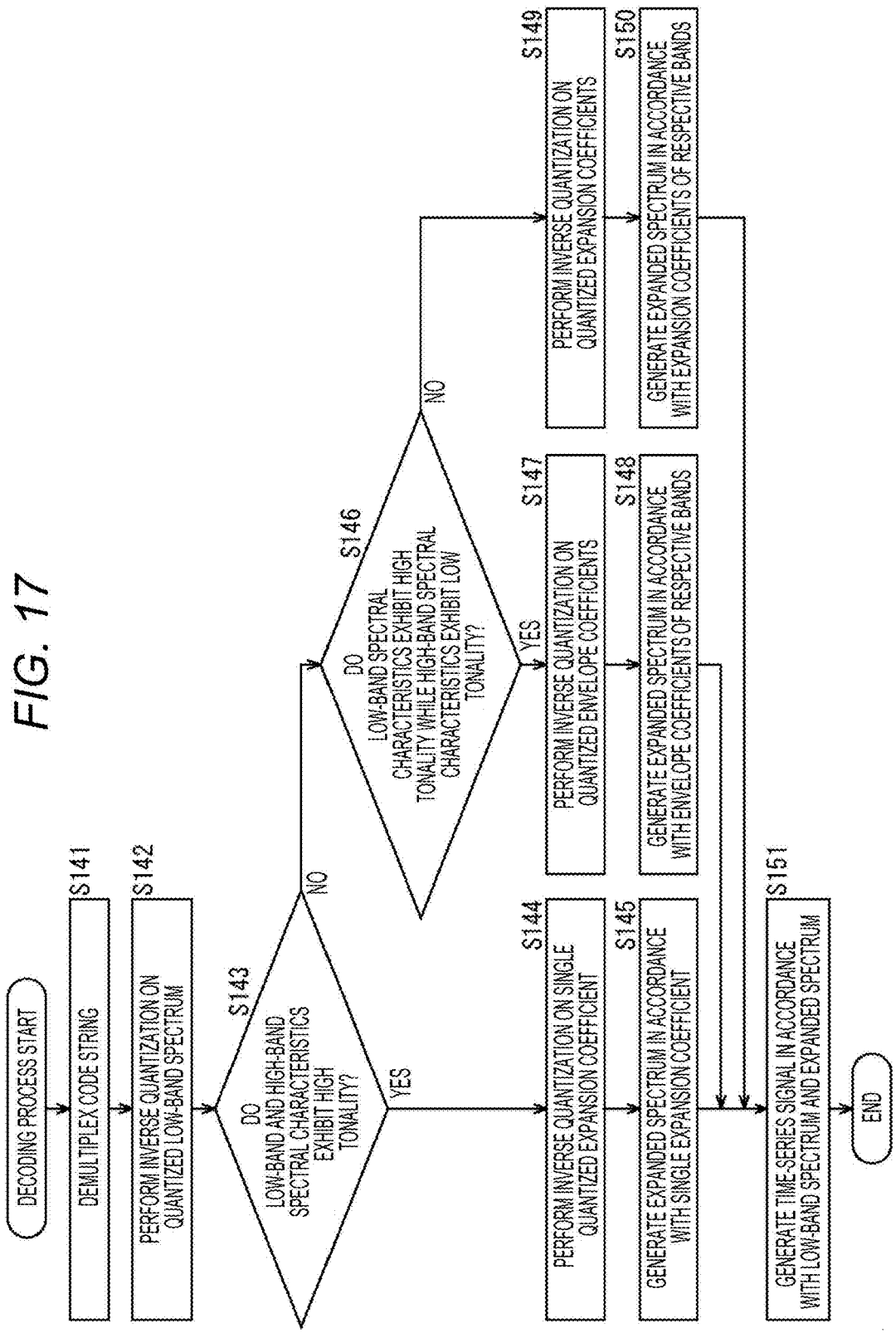
FIG. 17 is a flowchart for explaining a decoding process.

Referring now to the flowchart in FIG. 17, the decoding process to be performed by the decoding device 81 in a case where the encoding process described above with reference to FIG. 16 has been performed by the encoding device 11 is described.

Figure 7:
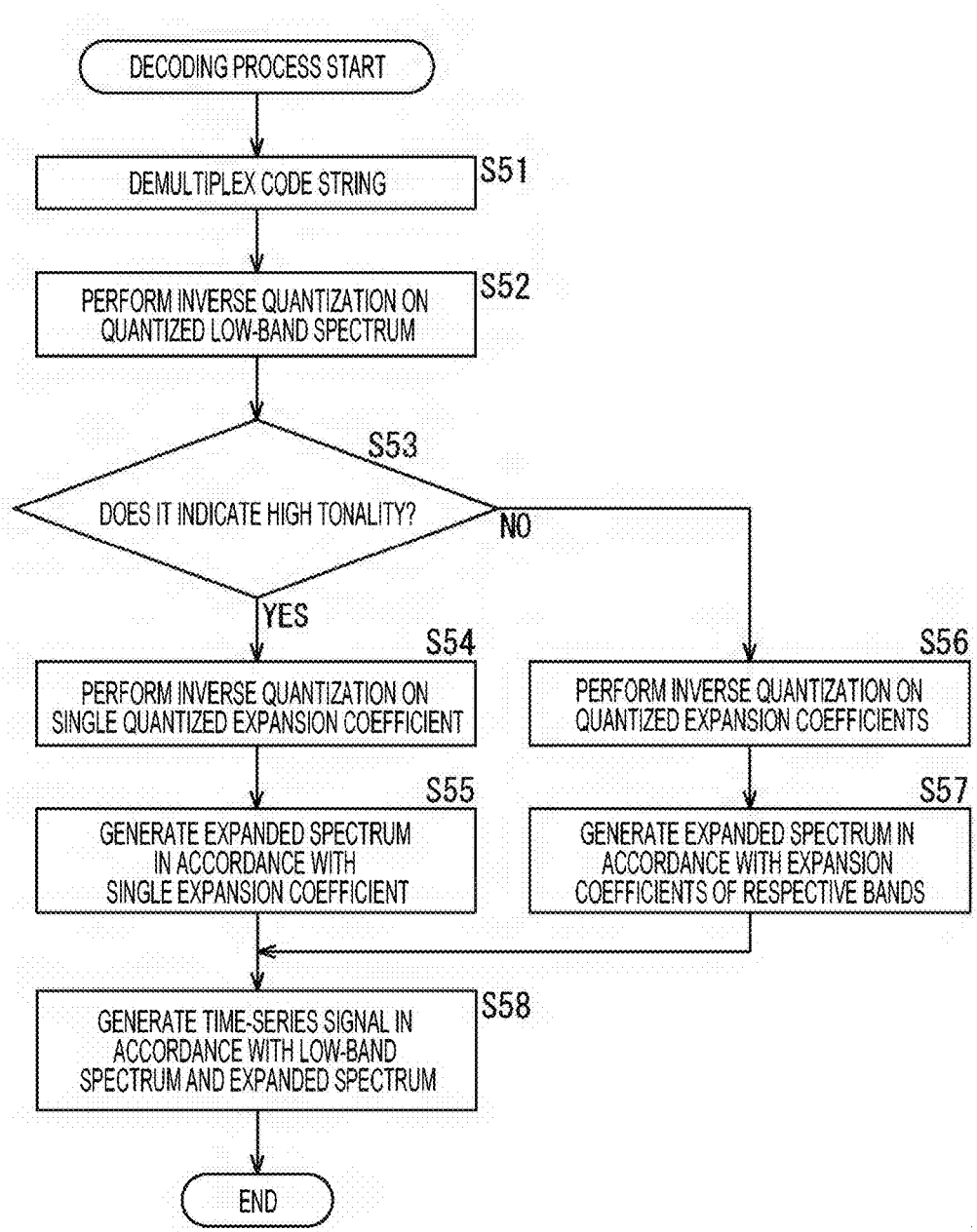
FIG. 7 is a flowchart for explaining a decoding process.

It should be noted that the procedures in steps S141 and S142 are similar to the procedures in steps S51 and S52 in FIG. 7, and therefore, explanation of them is not repeated herein. In step S141, however, the quantized expansion coefficient(s) or the quantized envelope coefficients obtained by demultiplexing a code string are supplied from the demultiplexer 91 to the expansion coefficient inverse quantization unit 93.

In step S143, in accordance with the spectral characteristic code supplied from the demultiplexer 91, the expansion coefficient inverse quantization unit 93 and the expanded spectrum generation unit 94 determine whether the spectral characteristics of the low band and the high band exhibit a high tonality.

For example, in a case where the value of the spectral characteristic code is "1", the spectral characteristics of the low band and the high band are determined to exhibit a high tonality. In this case, the code string includes a single quantized expansion coefficient, the quantized expansion coefficient is supplied from the demultiplexer 91 to the expansion coefficient inverse quantization unit 93.

If the spectral characteristics of the low band and the high band are determined to exhibit a high tonality in step S143, the procedures in steps S144 and S145 are carried out to generate an expanded spectrum, and the expanded spectrum is supplied to the IMDCT unit 95.

It should be noted that the procedures in steps S144 and S145 are similar to the procedures in steps S54 and S55 in FIG. 7, and therefore, explanation of them is not repeated herein. After the procedure in step S145 is carried out, the process moves on to step S151.

If the spectral characteristics of the low band and the high band are determined not to exhibit a high tonality in step S143, on the other hand, the process moves on to step S146.

In step S146, in accordance with the spectral characteristic code, the expansion coefficient inverse quantization unit 93 and the expanded spectrum generation unit 94 determine whether the spectral characteristics of the low band exhibit a high tonality while the spectral characteristics of the high band exhibit a low tonality. For example, in a case where the value of the spectral characteristic code is "2", the spectral characteristics of the low band are determined to exhibit a high tonality, and the spectral characteristics of the high band are determined to exhibit a low tonality.

If the spectral characteristics of the low band are determined to exhibit a high tonality while the spectral characteristics of the high band are determined to exhibit a low tonality in step S146, the process moves on to step S147. In this case, the quantized envelope coefficients of the respective bands in the high band are supplied from the demultiplexer 91 to the expansion coefficient inverse quantization unit 93.

In step S147, the expansion coefficient inverse quantization unit 93 inversely quantizes the quantized envelope coefficients that are of the respective bands constituting the high band and are supplied from the demultiplexer 91. The expansion coefficient inverse quantization unit 93 then supplies the obtained envelope coefficients to the expanded spectrum generation unit 94. As a result, the envelope coefficients L31 through L33 of the respective bands B31 through B33 shown in FIG. 15 are obtained, for example.

In step S148, in accordance with the envelope coefficients of the respective bands supplied from the expansion coefficient inverse quantization unit 93, the expanded spectrum generation unit 94 generates an expanded spectrum, and then supplies the expanded spectrum to the IMDCT unit 95.

Specifically, the expanded spectrum generation unit 94 generates random noise by allotting random numbers normalized to values in the range of −1.0 to 1.0 to the respective frequency bins in the expanded band, and multiplies the values of the random noise in the frequency bins in the respective bands by the envelope coefficients of the respective bands, to obtain an expanded spectrum.

After the expanded spectrum is generated, the process moves on to step S151.

Further, if the spectral characteristics of the low band are determined not to exhibit a high tonality while the spectral characteristics of the high band are determined not to exhibit a low tonality in step S146, the procedures in steps S149 and S150 are carried out.

In this case, the quantized expansion coefficients of the respective bands in the high band are supplied from the demultiplexer 91 to the expansion coefficient inverse quantization unit 93, and are inversely quantized. An expanded spectrum is then generated from the resultant expansion coefficients and the low-band spectrum. It should be noted that the procedures in steps S149 and S150 are similar to the procedures in steps S56 and S57 in FIG. 7, and therefore, explanation of them is not repeated herein.

After the expanded spectrum is generated in this manner, the process moves on to step S151.

After the expanded spectrum is generated through the procedure in step S145, S148, or S150, the procedure in step S151 is carried out, to generate a time-series signal. However, the procedure in step S151 is similar to the procedure in step S58 in FIG. 7, and therefore, the explanation is not repeated herein.

The time-series signal obtained in step S151 is output as the audio signal obtained through the decoding, and the decoding process then comes to an end.

In the above described manner, the decoding device 81 obtains the expansion coefficient(s) or the envelope coefficients corresponding to spectral characteristics by performing decoding and inverse quantization, and then generates an expanded spectrum with the use of the obtained expansion coefficient(s) or the envelope coefficients.

In this manner, the level of the seed spectrum or the random noise is adjusted with the use of the expansion coefficient(s) or the envelope coefficients corresponding to spectral characteristics, and an expanded spectrum is obtained. Thus, the level of the high band in the frequency region can be adjusted, and high-band level adjustment can be performed in accordance with spectral characteristics. Consequently, the delay time due to the band expansion at the time of decoding can be reduced, and high-quality sound can be obtained even in a resource-poor setting.

The above-described series of processes may be performed by hardware or may be performed by software. Where the series of processes are to be performed by software, the program that forms the software is installed into a computer. Here, the computer may be a computer incorporated into special-purpose hardware, or may be a general-purpose personal computer that can execute various kinds of functions, having various kinds of programs installed thereinto.

Figure 18:
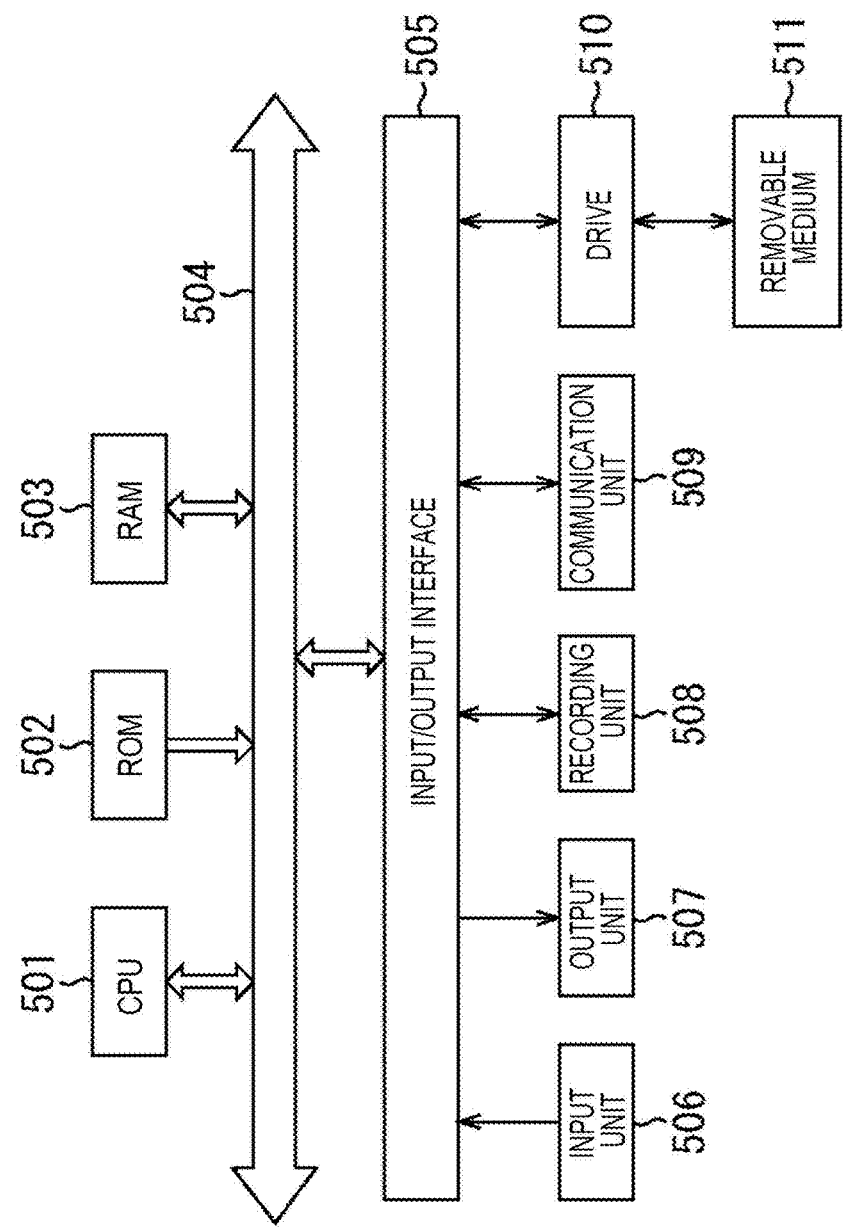
FIG. 18 is a diagram showing an example configuration of a computer.

FIG. 18 is a block diagram showing an example configuration of the hardware of a computer that performs the above-described series of processes in accordance with a program.

In the computer, a central processing unit (CPU) 501, a ROM 502, and a RAM 503 are connected to one another by a bus 504.

An input/output interface 505 is further connected to the bus 504. An input unit 506, an output unit 507, a recording unit 508, a communication unit 509, and a drive 510 are connected to the input/output interface 505.

The input unit 506 is formed with a keyboard, a mouse, a microphone, an imaging device, and the like. The output unit 507 is formed with a display, a speaker, and the like. The recording unit 508 is formed with a hard disk, a nonvolatile memory, or the like. The communication unit 509 is formed with a network interface or the like. The drive 510 drives a removable medium 511 such as a magnetic disk, an optical disk, a magneto optical disk, or a semiconductor memory.

In the computer having the above configuration, the CPU 501 loads a program recorded on the recording unit 508 into the RAM 503 via the input/output interface 505 and the bus 504, for example, and executes the program, so that the above-described series of processes are performed.

The program to be executed by the computer (the CPU 501) may be recorded on the removable medium 511 as a packaged medium to be provided, for example. Alternatively, the program can be provided via a wired or wireless transmission medium, such as a local area network, the Internet, or digital satellite broadcasting.

In the computer, the program can be installed into the recording unit 508 via the input/output interface 505 when the removable medium 511 is mounted on the drive 510. The program can also be received by the communication unit 509 via a wired or wireless transmission medium, and be installed into the recording unit 508. Alternatively, the program may be installed beforehand into the ROM 502 or the recording unit 508.

It should be noted that the program to be executed by the computer may be a program for performing processes in chronological order in accordance with the sequence described in this specification, or may be a program for performing processes in parallel or performing a process when necessary, such as when there is a call.

It should be noted that embodiments of the present technology are not limited to the above-escribed embodiments, and various modifications may be made to them without departing from the scope of the present technology.

For example, the present technology can be embodied in a cloud computing configuration in which one function is shared among devices via a network, and processing is performed by the devices cooperating with one another.

Also, the respective steps described with reference to the above described flowcharts can be carried out by one device or can be shared among devices.

In a case where more than one process is included in one step, the processes included in the step can be performed by one device or can be shared among devices.

Further, the present technology may also be embodied in the configurations described below.

[1]

A decoding device including:

an acquisition unit that acquires a low-band spectrum, and a single expansion coefficient of an expanded band or expansion coefficients of the respective bands constituting the expanded band, the expanded band being different from a low band, the single expansion coefficient or the expansion coefficients being for obtaining an expanded spectrum of the expanded band;

a generation unit that generates the expanded spectrum in accordance with the single expansion coefficient or the expansion coefficients of the respective bands; and a combining unit that combines the low-band spectrum and the expanded spectrum.

[2]

The decoding device of [1], wherein the generation unit generates the expanded spectrum in accordance with the low-band spectrum and the expansion coefficient.

[3]

The decoding device of [2], wherein the generation unit generates the expanded spectrum by adjusting the level of a spectrum obtained from the low-band spectrum, in accordance with the expansion coefficient.

[4]

The decoding device of [3], wherein:

when the expanded spectrum is generated in accordance with the single expansion coefficient, the generation unit adjusts the level of the entire expanded band of the spectrum in accordance with the expansion coefficient; and, when the expanded spectrum is generated in accordance with the expansion coefficients of the respective bands, the generation unit adjusts the levels of the bands in the spectrum in accordance with the expansion coefficients of the bands.

[5]

The decoding device of [1], wherein the generation unit generates the expanded spectrum by adjusting the level of predetermined noise in accordance with the expansion coefficient.

[6]

The decoding device of any of [1] through [5], wherein the value of the low-band spectrum is determined by the amplitude component and the phase component of the original time-series signal.

[7]

The decoding device of [6], wherein the low-band spectrum is an MDCT spectrum.

[8]

A decoding method including the steps of:

acquiring a low-band spectrum, and a single expansion coefficient of an expanded band or expansion coefficients of the respective bands constituting the expanded band, the expanded band being different from a low band, the single expansion coefficient or the expansion coefficients being for obtaining an expanded spectrum of the expanded band;

generating the expanded spectrum in accordance with the single expansion coefficient or the expansion coefficients of the respective bands; and combining the low-band spectrum and the expanded spectrum.

[9]

A program for causing a computer to perform a process including the steps of:

acquiring a low-band spectrum, and a single expansion coefficient of an expanded band or expansion coefficients of the respective bands constituting the expanded band, the expanded band being different from a low band, the single expansion coefficient or the expansion coefficients being for obtaining an expanded spectrum of the expanded band;

generating the expanded spectrum in accordance with the single expansion coefficient or the expansion coefficients of the respective bands; and combining the low-band spectrum and the expanded spectrum.

[10]

An encoding device including:

a feature quantity extraction unit that extracts a feature quantity from a spectrum obtained by performing orthogonal transform on a time-series signal;

a calculation unit that calculates, in accordance with the feature quantity, a single expansion coefficient of an expanded band or expansion coefficients of the respective bands constituting the expanded band from the spectrum, the expanded band being different from the low band of the spectrum, the single expansion coefficient or the expansion coefficients being for obtaining an expanded spectrum of the expanded band; and a multiplexer that generates a code string by multiplexing a low-band spectrum as the low-band component of the spectrum and the expansion coefficient.

[11]

The encoding device of [10], wherein the feature quantity is information indicating the tonality of the spectrum.

[12]

The encoding device of [11], wherein:

when the tonality of the spectrum is high, the calculation unit calculates the single expansion coefficient; and, when the tonality of the spectrum is low, the calculation unit calculates the expansion coefficients of the respective bands.

[13]

The encoding device of any of [10] through [12], wherein the calculation unit calculates the ratio between the mean amplitude of the expanded band of the spectrum to the mean amplitude of the low-band spectrum, and sets the ratio as the expansion coefficient.

[14]

The encoding device of [11], wherein, when the tonality of the low band of the spectrum is high while the tonality of the expanded band of the spectrum is low, the calculation unit calculates envelope information about the expanded band of the spectrum as the expansion coefficient.

[15]

The encoding device of any of [10] through [14], wherein the value of the spectrum is determined by the amplitude component and the phase component of the time-series signal.

[16]

The encoding device of [15], wherein the orthogonal transform is MDCT.

[17]

An encoding method including the steps of:

extracting a feature quantity from a spectrum obtained by performing orthogonal transform on a time-series signal;

calculating, in accordance with the feature quantity, a single expansion coefficient of an expanded band or expansion coefficients of the respective bands constituting the expanded band from the spectrum, the expanded band being different from the low band of the spectrum, the single expansion coefficient or the expansion coefficients being for obtaining an expanded spectrum of the expanded band; and generating a code string by multiplexing a low-band spectrum as the low-band component of the spectrum and the expansion coefficient.

[18]

A program for causing a computer to perform a process including the steps of:

extracting a feature quantity from a spectrum obtained by performing orthogonal transform on a time-series signal;

calculating, in accordance with the feature quantity, a single expansion coefficient of an expanded band or expansion coefficients of the respective bands constituting the expanded band from the spectrum, the expanded band being different from the low band of the spectrum, the single expansion coefficient or the expansion coefficients being for obtaining an expanded spectrum of the expanded band; and generating a code string by multiplexing a low-band spectrum as the low-band component of the spectrum and the expansion coefficient.

REFERENCE SIGNS LIST

11 Encoding device
21 MDCT unit
22 Spectral quantization unit
23 Low-band feature quantity extraction unit
24 High-band feature quantity extraction unit
25 Spectral characteristics determination unit
26 Expansion coefficient calculation unit
27 Expansion coefficient quantization unit
28 Multiplexer
81 Decoding device
91 Demultiplexer
92 Spectral inverse quantization unit
93 Expansion coefficient inverse quantization unit
94 Expanded spectrum generation unit
95 IMDCT unit

The invention claimed is:

1. A decoding device comprising:

an acquisition unit configured to acquire a code string representative of an audio signal, the code string including a low-band spectrum, and a single expansion coefficient of an expanded band or a plurality of expansion coefficients of respective bands constituting the expanded band, the expanded band being different from a low band, the single expansion coefficient or the plurality of expansion coefficients being for obtaining an expanded spectrum of the expanded band;

a generation unit configured to generate the expanded spectrum by adjusting a level of a seed spectrum or a random noise in accordance with a selection of the expansion coefficients or envelope coefficients corresponding to spectral characteristics, the expansion coefficients or the envelope coefficients for generating the expanded spectrum being selected based on a relative tonality of the low-band spectrum and a high-band spectrum; and a combining unit configured to combine the low-band spectrum and the expanded spectrum and to output a time-series signal representative of the audio signal.

2. The decoding device according to claim 1, wherein a value of the low-band spectrum is determined by an amplitude component and a phase component of an original time-series signal.

3. The decoding device according to claim 2, wherein the low-band spectrum is an MDCT spectrum.

4. A decoding method comprising:

acquiring a code string representative of an audio signal, the code string including a low-band spectrum, and a single expansion coefficient of an expanded band or a plurality of expansion coefficients of respective bands constituting the expanded band, the expanded band being different from a low band, the single expansion coefficient or the plurality of expansion coefficients being for obtaining an expanded spectrum of the expanded band;

generating the expanded spectrum by adjusting a level of a seed spectrum or a random noise in accordance with a selection of the expansion coefficients or envelope coefficients corresponding to spectral characteristics, the expansion coefficients or the envelope coefficients for generating the expanded spectrum being selected based on a relative tonality of the low-band spectrum and a high-band spectrum; and combining the low-band spectrum and the expanded spectrum and outputting a time-series signal representative of the audio signal.

5. The decoding method according to claim 4, wherein a value of the low-band spectrum is determined by an amplitude component and a phase component of an original time-series signal.

6. The decoding method according to claim 5, wherein the low-band spectrum is an MDCT spectrum.

7. A non-transitory computer-readable medium containing computer-executable instructions that, when executed by a processing device, perform a process, the process comprising:

acquiring a code string representative of an audio signal, the code string including a low-band spectrum, and a single expansion coefficient of an expanded band or a plurality of expansion coefficients of respective bands constituting the expanded band, the expanded band being different from a low band, the single expansion coefficient or the plurality of expansion coefficients being for obtaining an expanded spectrum of the expanded band;

generating the expanded spectrum by adjusting a level of a seed spectrum or a random noise in accordance with a selection of the expansion coefficients or envelope coefficients corresponding to spectral characteristics, the expansion coefficients or the envelope coefficients for generating the expanded spectrum being selected based on a relative tonality of the low-band spectrum and a high-band spectrum; and combining the low-band spectrum and the expanded spectrum and outputting a time-series signal representative of the audio signal.

* * * * *